(12) United States Patent
Kwak et al.

(10) Patent No.: US 7,312,110 B2
(45) Date of Patent: Dec. 25, 2007

(54) METHODS OF FABRICATING SEMICONDUCTOR DEVICES HAVING THIN FILM TRANSISTORS

(75) Inventors: Kun-Ho Kwak, Gyeonggi-do (KR); Sung-Jin Kim, Gyeonggi-do (KR); Soon-Moon Jung, Gyeonggi-do (KR); Won-Seok Cho, Gyeonggi-do (KR); Jae-Hoon Jang, Gyeonggi-do (KR); Hoon Lim, Seoul (KR); Jong-Hyuk Kim, In-cheon (KR); Myang-Sik Han, Gyeonggi-do (KR); Byung-Jun Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/098,648

(22) Filed: Apr. 4, 2005

(65) Prior Publication Data

US 2005/0221544 A1    Oct. 6, 2005

(30) Foreign Application Priority Data

Apr. 6, 2004   (KR) ...................... 10-2004-0023548
Sep. 8, 2004   (KR) ...................... 10-2004-0071884

(51) Int. Cl.
    *H01L 21/00* (2006.01)
(52) U.S. Cl. ...................... 438/150; 438/637; 438/197; 438/198; 438/199; 257/E51.005; 257/E29.119; 257/E29.004
(58) Field of Classification Search ................. 438/149, 438/150, 197, 198, 199, 637; 257/E51.001, 257/E29.119, E29.004
See application file for complete search history.

(56) References Cited

U.S. PATENT DOCUMENTS

| | | | |
|---|---|---|---|
| 5,156,987 A | 10/1992 | Sandhu et al. | |
| 6,022,766 A | 2/2000 | Chen et al. | |
| 6,525,340 B2 * | 2/2003 | Colavito et al. | 257/57 |
| 6,653,714 B2 * | 11/2003 | Matsuno et al. | 257/588 |
| 2001/0023953 A1 * | 9/2001 | Schuegraf et al. | 257/296 |
| 2002/0119624 A1 * | 8/2002 | Schuegraf et al. | 438/253 |
| 2002/0197794 A1 | 12/2002 | Lee | |

FOREIGN PATENT DOCUMENTS

| JP | 10-027887 | 1/1998 |
|---|---|---|
| JP | 11-233789 | 8/1999 |
| KR | 10-2003-0002745 A | 1/2003 |

* cited by examiner

*Primary Examiner*—Thao P. Le
(74) *Attorney, Agent, or Firm*—Myers Bigel Sibley & Sajovec

(57) ABSTRACT

Methods of fabricating semiconductor devices are provided. An interlayer insulating layer is provided on a single crystalline semiconductor substrate. A single crystalline semiconductor plug is provided that extends through the interlayer insulating layer and a molding layer pattern is provided on the semiconductor substrate and the single crystalline semiconductor plug. The molding layer pattern defines an opening therein that at least partially exposes a portion of the single crystalline semiconductor plug. A single crystalline semiconductor epitaxial pattern is provided on the exposed portion of single crystalline semiconductor plug using a selective epitaxial growth technique that uses the exposed portion of the single crystalline semiconductor plug as a seed layer. A single crystalline semiconductor region is provided in the opening. The single crystalline semiconductor region includes at least a portion of the single crystalline semiconductor epitaxial pattern.

50 Claims, 25 Drawing Sheets

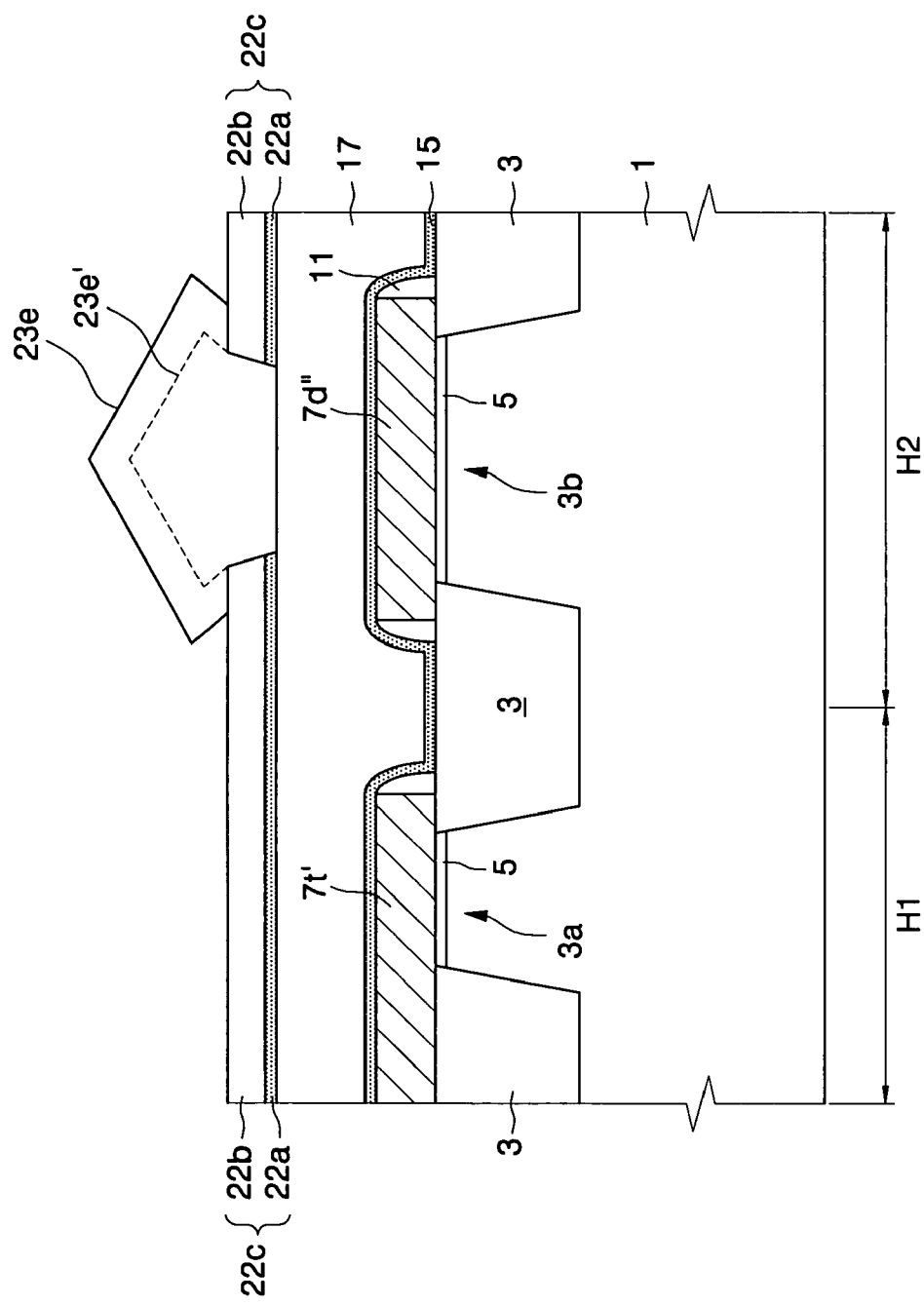

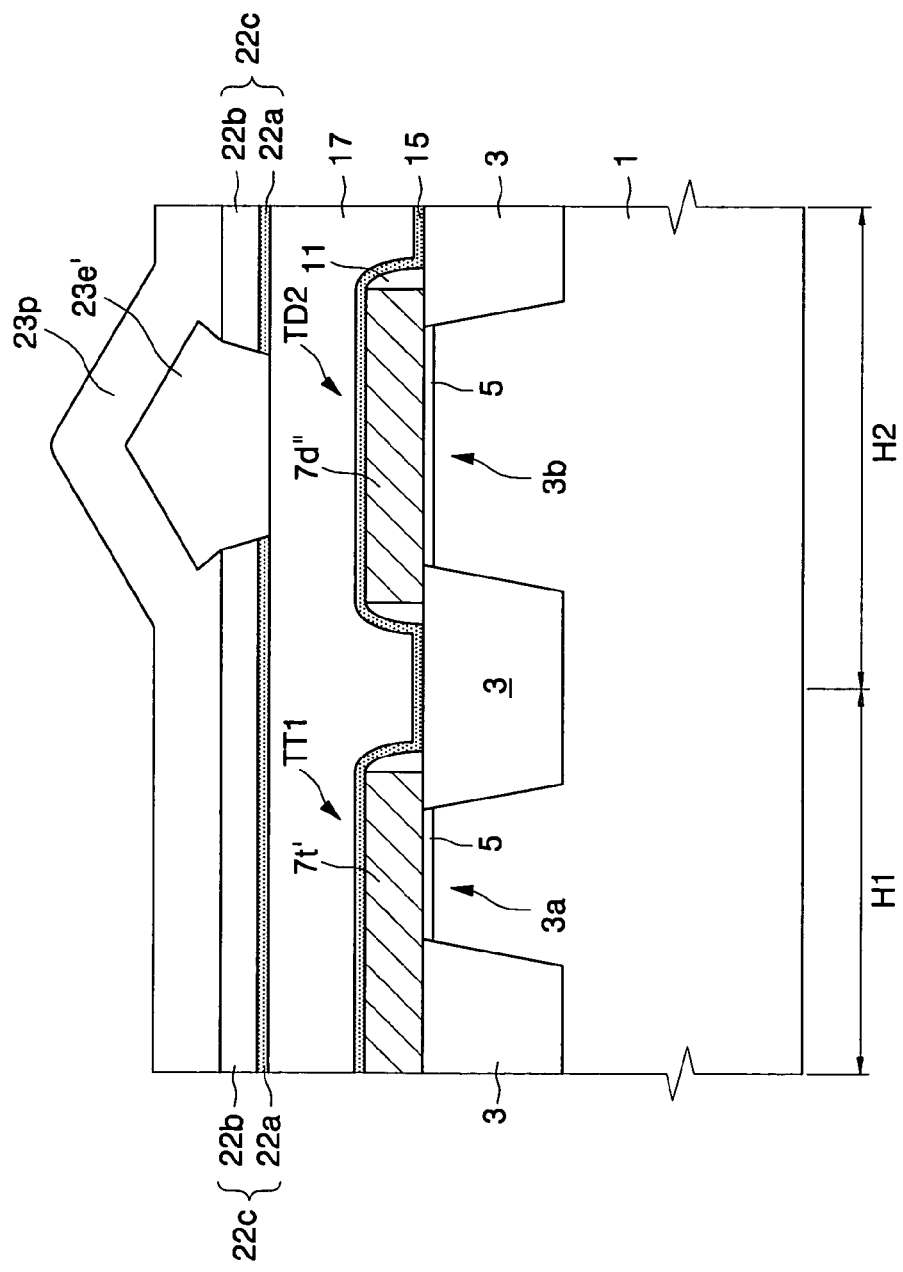

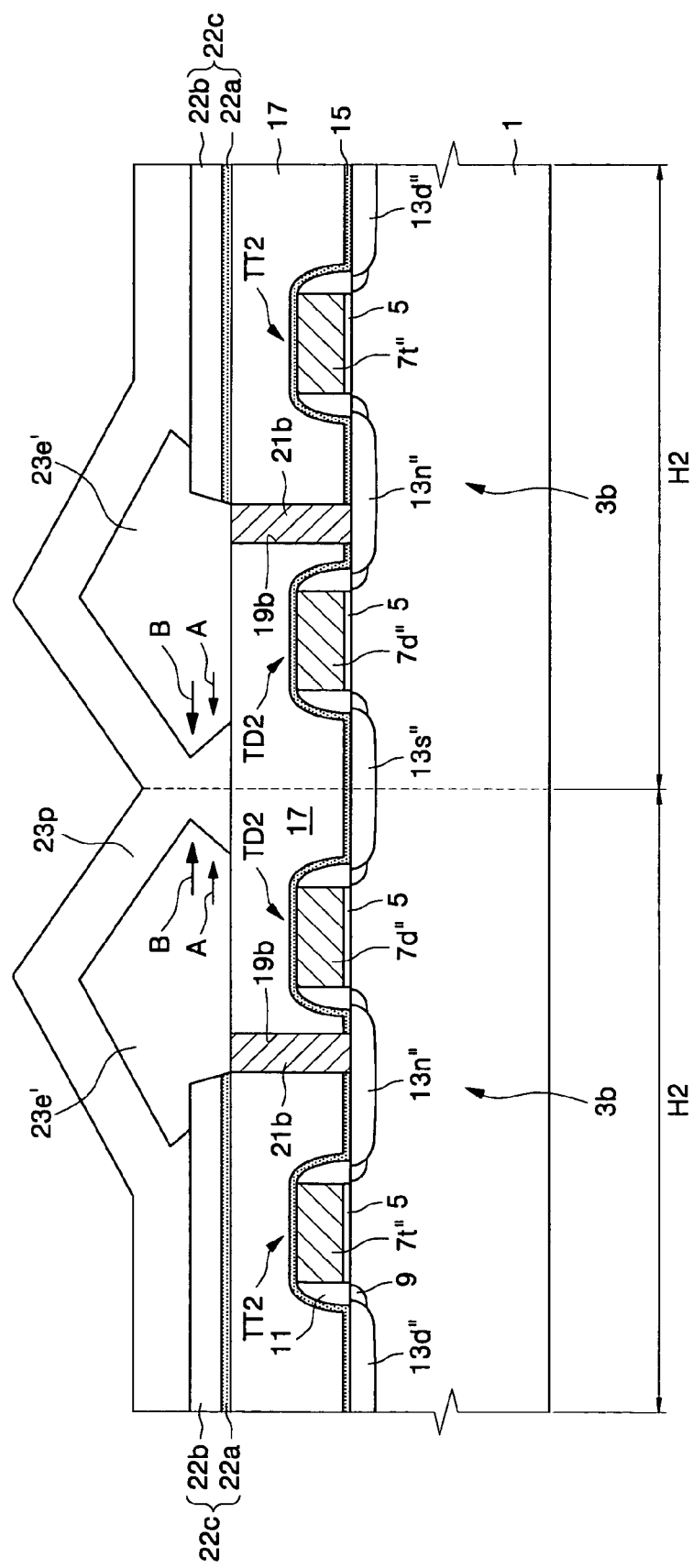

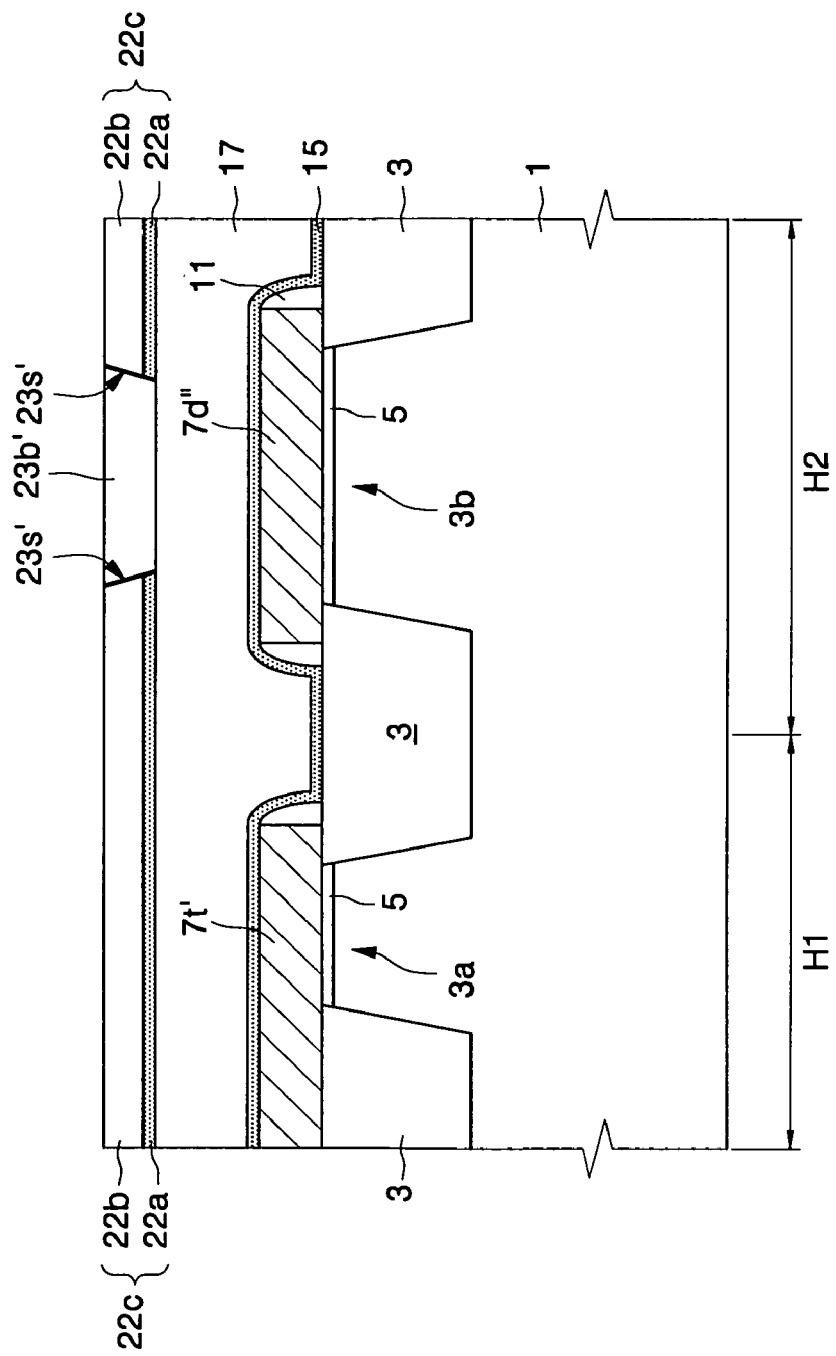

METHODS OF FABRICATING SEMICONDUCTOR DEVICES HAVING THIN FILM TRANSISTORS

CLAIM OF PRIORITY

This application is related to and claims priority from Korean Patent Application No. 2004-0023548, filed Apr. 6, 2004 and Korean Patent Application No. 2004-0071884, filed on Sep. 8, 2004, the disclosures of which are hereby incorporated herein by reference as if set forth in their entirety.

FIELD OF THE INVENTION

The present invention relates to methods of fabricating semiconductor devices and devices fabricated thereby and, more particularly, methods of fabricating semiconductor devices having thin film transistors and devices fabricated thereby.

BACKGROUND OF THE INVENTION

In the field of integrated circuits, devices, such as metal oxide semiconductor (MOS) transistors, may be used as switching devices. Typically, MOS transistors are formed having channel regions, source regions and drain regions in a semiconductor substrate. These MOS transistors may be referred to as bulk MOS transistors. Integrated circuit devices including, for example, complementary metal oxide semiconductor (CMOS) circuits that include N-channel bulk MOS transistors and P-channel bulk MOS transistors, may not provide adequate integration densities due to, for example, a latch-up phenomenon that occurs in CMOS circuits.

Recently, thin film transistors (TFTs) provided on the semiconductor substrate have been developed and used in order to improve the integration density of integrated circuit devices as well as the latch-up immunity of the CMOS circuits. For example, TFTs have been used in a unit cell of a static random access memory (SRAM). The SRAM may have improved power consumption and operating speeds relative to, for example, a dynamic random access memory (DRAM). Therefore, SRAMs are widely used as cache memory in, for example, computers and portable electronic devices.

A unit cell of an SRAM can generally be divided into two categories, a high-load resistor SRAM cell using a large resistor as a load device and a CMOS SRAM cell using a P-channel metal oxide semiconductor (PMOS) transistor as the load device. The CMOS SRAM cell may be, for example, a TFT SRAM cell or a bulk CMOS SRAM cell. The TFT SRAM cell may use the TFT as the load device. The bulk CMOS SRAM cell may use the bulk MOS transistor as the load device.

The bulk CMOS SRAM cell typically exhibits high cell stability relative to the TFT SRAM cell and the high-load resistor SRAM cell. Furthermore, the bulk CMOS SRAM cell exhibits excellent low voltage characteristics and low stand-by currents. This may be due to the use of a poly-crystalline silicon (polysilicon) layer as a body layer in the fabrication of the TFT device, whereas transistors included in the bulk CMOS SRAM cell typically include a single crystalline silicon substrate. However, as discussed above, bulk CMOS SRAM cells typically exhibit low integration density and weak latch-up immunity relative to the TFT SRAM cell. Therefore, in order to provide a highly integrated SRAM having improved relative reliability, the characteristics of the load transistors used in the TFT SRAM cell may be improved.

Semiconductor devices having TFTs on a semiconductor substrate are discussed in U.S. Pat. No. 6,022,766 to Chen et al., entitled Semiconductor Structure Incorporating Thin Film Transistors and Methods for its Manufacture. As discussed in Chen, a conventional bulk MOS transistor may be formed on a single crystalline silicon substrate and a TFT may be provided on the bulk MOS transistor. One of the source region or the drain region of the bulk MOS transistor is electrically coupled to one of the source region or the drain region of the TFT through a metal plug. The metal plug may include, for example, tungsten. Accordingly, when the bulk MOS transistor and the TFT are, for example, an n-channel metal oxide semiconductor (NMOS) transistor and a positive channel metal oxide semiconductor (PMOS) transistor, respectively, the bulk MOS transistor may have an ohmic contact with the TFT film transistor through the metal plug.

Furthermore, a body layer of the TFT may be formed by, for example, depositing an amorphous silicon layer on a surface of the semiconductor substrate including the metal plug and crystallizing the amorphous silicon layer using, for example, an annealing process. The body layer may include a poly-silicon layer having large grains. In other words, it may be difficult to transform the body layer into a complete single crystalline silicon layer. Consequently, it may be difficult to form the TFT having electrical characteristics corresponding to the bulk MOS transistor.

SUMMARY OF THE INVENTION

Some embodiments of the present invention provide methods of fabricating semiconductor devices. An interlayer insulating layer is provided on a single crystalline semiconductor substrate. A single crystalline semiconductor plug is provided that extends through the interlayer insulating layer and a molding layer pattern is provided on the semiconductor substrate and the single crystalline semiconductor plug. The molding layer pattern defines an opening therein that at least partially exposes a portion of the single crystalline semiconductor plug. A single crystalline semiconductor epitaxial pattern is provided on the exposed portion of single crystalline semiconductor plug using a selective epitaxial growth technique that uses the exposed portion of the single crystalline semiconductor plug as a seed layer. A single crystalline semiconductor region is provided in the opening. The single crystalline semiconductor region includes at least a portion of the single crystalline semiconductor epitaxial pattern.

In further embodiments of the present invention, the single crystalline semiconductor may be formed by patterning the interlayer insulating layer to form a contact hole therein. The contact hole may expose at least a portion of the semiconductor substrate. A single crystalline semiconductor epitaxial layer may be provided in the contact hole using a selective epitaxial growth technique that uses the exposed portion of the single crystalline semiconductor substrate as a seed layer. The single crystalline semiconductor epitaxial layer may be planarized.

In still further embodiments of the present invention, the molding layer pattern may be formed by forming a molding layer on the semiconductor substrate and the single crystalline semiconductor plug. The molding layer may be patterned such that at least a portion of the single crystalline semiconductor plug is exposed through the molding layer. The molding layer may include a single layer of silicon oxide.

In some embodiments of the present invention, the molding layer pattern may be formed by providing a lower molding layer on the semiconductor substrate and the single crystalline semiconductor plug. An upper molding layer may be provided on the lower molding layer. The upper and lower molding layers may be patterned such that at least a portion of the single crystalline semiconductor plug is exposed through the upper and lower molding layers. The lower molding layer may include an insulating layer having an etch selectivity with respect to the interlayer insulating layer and the upper molding layer may include an insulating layer having an etch selectivity with respect to the lower molding layer. In certain embodiments of the present invention, the lower molding layer may include a silicon nitride layer and the upper molding layer may include a silicon oxide layer.

In further embodiments of the present invention, the molding layer pattern may be formed by forming a sacrificial layer pattern on the semiconductor substrate and the single crystalline semiconductor plug. A molding layer may be provided on the sacrificial layer pattern and the interlayer insulating layer. The molding layer may be planarized to expose at least a portion of an upper surface of the sacrificial layer pattern. The sacrificial layer pattern may be selectively removed to expose at least a portion of the single crystalline semiconductor plug. The sacrificial layer pattern may include a material layer having an etch selectivity with respect to both the interlayer insulating layer and the molding layer. In certain embodiments of the present invention, the sacrificial layer pattern may include a silicon nitride layer and the molding layer may include a silicon oxide layer.

In still further embodiments of the present invention, the single crystalline semiconductor region may be formed by planarizing the single crystalline semiconductor epitaxial pattern until at least a portion of an upper surface of the molding layer pattern is exposed.

In some embodiments of the present invention, the single crystalline semiconductor region may be formed by forming one of an amorphous semiconductor layer and a polycrystalline semiconductor layer on the substrate and the single crystalline semiconductor epitaxial pattern. The one of the amorphous semiconductor layer and the polycrystalline semiconductor layer may be crystallized using a solid phase epitaxial technique. The crystallized semiconductor layer and the single crystalline semiconductor epitaxial pattern may be planarized until a top surface of the molding layer pattern is exposed.

In further embodiments of the present invention, the single crystalline semiconductor region may be formed by providing one of an amorphous semiconductor layer and a polycrystalline semiconductor layer on the semiconductor substrate and the single crystalline semiconductor epitaxial pattern. The one of the amorphous semiconductor layer and the polycrystalline semiconductor layer and the single crystalline semiconductor epitaxial pattern may be planarized until at least a portion of an upper surface of the molding layer pattern is exposed. The one of the planarized amorphous semiconductor layer and the planarized polycrystalline semiconductor layer may be crystallized using a solid phase epitaxial technique.

In still further embodiments of the present invention, a thin film transistor may be formed on the single crystalline semiconductor region. The thin film transistor may be formed by providing an insulated gate electrode that crosses over the single crystalline semiconductor region. Impurity ions may be implanted into the single crystalline semiconductor region using the gate electrode as an ion implantation mask to provide source and drain regions.

In some embodiments of the present invention, the formation of the interlayer insulating layer may be preceded by forming an isolation layer on the single crystalline semiconductor substrate. The isolation layer may define an active region. A bulk metal oxide semiconductor (MOS) transistor may be provided on the active region. The bulk MOS transistor may include a gate electrode, a source region and a drain region. The gate electrode may cross over the active region. The source and drain regions may be respectively formed on the active region on first and second sides of a channel region under the gate electrode. The single crystalline semiconductor plug may contact at least one of the source and drain regions of the bulk MOS transistor.

Further embodiments of the present invention provide methods of fabricating thin film transistor (TFT) static random access memory (SRAM) cells having first and second half-cells. The fabrication of the first and/or second half-cell including providing an isolation layer on a single crystalline semiconductor substrate to define an active region of the semiconductor substrate. A driver transistor is formed on the active region. The driver transistor includes a driver gate electrode that crosses over the active region and source and drain regions on first and second sides, respectively, of a channel region under the driver gate electrode. An interlayer insulating layer is provided on the semiconductor substrate and the driver transistor. A single crystalline semiconductor plug is provided that extends through the interlayer insulating layer and contacts the drain region of the driver transistor. A molding layer pattern is provided on the semiconductor substrate and the single crystalline semiconductor plug. The molding layer pattern defines an opening therein that exposes at least a portion of the single crystalline semiconductor plug. A single crystalline semiconductor epitaxial pattern is provided on the exposed portion of the single crystalline semiconductor plug using a selective epitaxial growth technique that uses the exposed portion of the single crystalline semiconductor plug as a seed layer. A single crystalline semiconductor region is provided in the opening. The single crystalline semiconductor region includes at least a portion of the single crystalline semiconductor epitaxial pattern.

BRIEF DESCRIPTION OF THE DRAWINGS

FIGS. 3A through 8A are cross sections taken along line I-I' of FIG. 2 illustrating processing steps in the fabrication of TFT CMOS SRAM cells according to some embodiments of the present invention.

FIGS. 3B through 8B are cross sections taken along line II-II' of FIG. 2 illustrating processing steps in the fabrication of TFT CMOS SRAM cells according to some embodiments of the present invention.

FIGS. 9A and 10A are cross sections taken along line I-I' of FIG. 2 illustrating processing steps in the fabrication of TFT CMOS SRAM cells according to some embodiments of the present invention.

FIGS. 9B and 10B are cross sections taken along line II-II' of FIG. 2 illustrating processing steps in the fabrication of TFT CMOS SRAM cells according to some embodiments of the present invention.

FIGS. 11A through 13A are cross sections taken along line I-I' of FIG. 2 illustrating processing steps in the fabrication of TFT CMOS SRAM cells according to some embodiments of the present invention.

FIGS. 11B through 13B are cross sections taken along line II-II' of FIG. 2 illustrating processing steps in the fabrication of TFT CMOS SRAM cells according to some embodiments of the present invention.

DETAILED DESCRIPTION OF EMBODIMENTS OF THE PRESENT INVENTION

Figure 1:
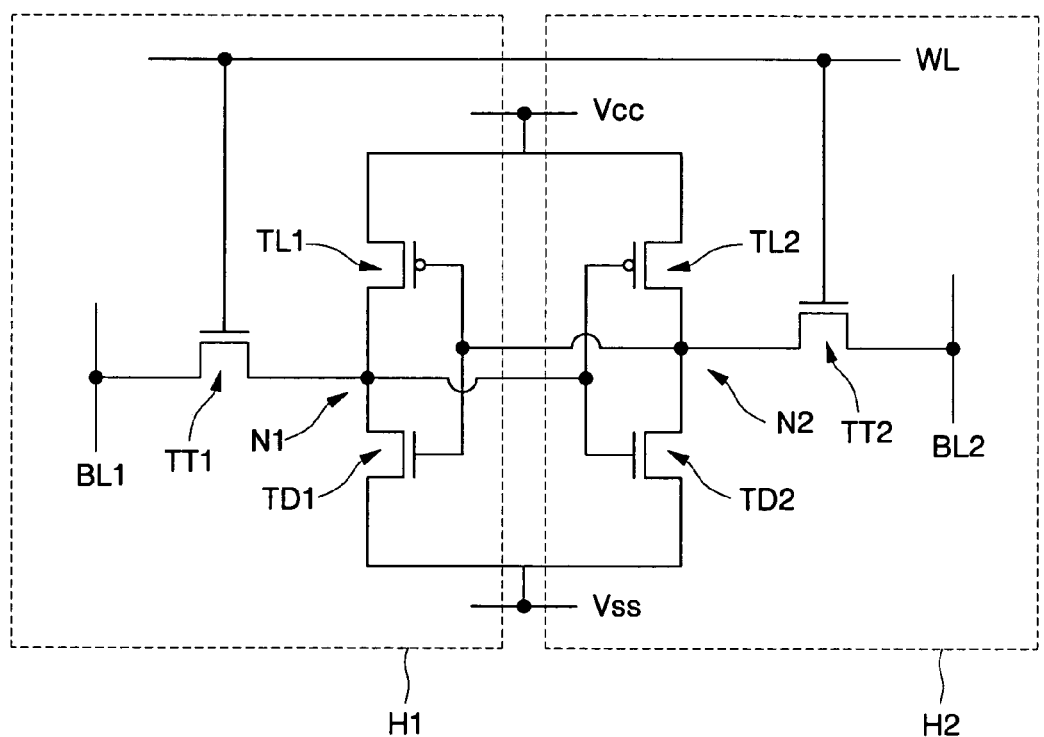
FIG. 1 is an equivalent circuit diagram illustrating complementary metal oxide semiconductors (CMOSs) static random access memory (SRAM) cells according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention will now be described with respect to FIGS. 1 through 14. As discussed herein, some embodiments of the present invention provide semiconductor devices including a single crystalline semiconductor plug that extends through an interlayer insulating layer. A single crystalline semiconductor epitaxial pattern is grown on the interlayer insulating layer using the single crystalline semiconductor plug as a seed layer. The single crystalline semiconductor epitaxial pattern is planarized using a molding layer pattern formed on the interlayer insulating layer. As a result, a semiconductor region having a uniform thickness and an excellent single crystalline structure may be formed on the interlayer insulating layer according to some embodiments of the present invention. Therefore, if a thin film transistor (TFT) is provided on the single crystalline semiconductor region, the integration density, reliability and electrical characteristics of a semiconductor device may be improved relative to conventional structures.

Referring now to FIG. 1, an equivalent circuit diagram of a complementary metal oxide semiconductor (CMOS) static random access memory (SRAM) cell according to some embodiments of the present invention will be discussed. It will be understood that the CMOS SRAM cell may be, for example, a thin film transistor (TFT) CMOS SRAM cell or a bulk CMOS SRAM cell. As illustrated in FIG. 1, the CMOS SRAM cell includes a pair of driver transistors TD1 and TD2, a pair of transfer transistors TT1 and TT2, and a pair of load transistors TL1 and TL2. In some embodiments of the present invention, the pair of driver transistors TD1 and TD2 and the pair of transfer transistors TT1 and TT2 are negative-channel metal oxide semiconductor (NMOS) transistors and the pair of load transistors TL1 and TL2 are positive-channel metal oxide semiconductor (PMOS) transistors.

The pair of driver transistors TD1 and TD2, the pair of transfer transistors TT1 and TT2, and the pair of load transistors TL1 and TL2 are connected as illustrated in FIG. 1. In particular, the first driver transistor TD1 and the first transfer transistor TT1 are serially connected to each other. A source region of the first driver transistor TD1 is electrically coupled to a ground line Vss, and a drain region of the first transfer transistor TT1 is electrically coupled to a first bit line BL1. Similarly, the second driver transistor TD2 and the second transfer transistor TT2 are serially connected to each other. A source region of the second driver transistor TD2 is electrically coupled to the ground line Vss, and a drain region of the second transfer transistor TT2 is electrically coupled to a second bit line BL2.

Furthermore, a source region and a drain region of the first load transistor TL1 are electrically coupled to a power supply line Vcc and a drain region of the first driver transistor TD1, respectively. Similarly, a source region and a drain region of the second load transistor TL2 are electrically coupled to the power supply line Vcc and a drain region of the second driver transistor TD2, respectively. The drain region of the first load transistor TL1, the drain region of the first driver transistor TD1, and the source region of the first transfer transistor TT1 are electrically coupled to each other and constitute a first node N1. The drain region of the second load transistor TL2, the drain region of the second driver transistor TD2, and the source region of the second transfer transistor TT2 are electrically coupled to each other and constitute a second node N2. A gate electrode of the first driver transistor TD1 and a gate electrode of the first load transistor TL1 are electrically coupled to the second node N2, and a gate electrode of the second driver transistor TD2 and a gate electrode of the second load transistor TL2 are electrically coupled to the first node N1. Furthermore, gate electrodes of the first and second transfer transistors TT1 and TT2 are electrically coupled to a word line WL.

CMOS SRAM cells according to some embodiments of the present invention exhibit a relatively small stand-by current as well as a large noise margin compared to a high-load resistor SRAM cell. Thus, the CMOS SRAM cell is widely used in high performance SRAMs having a low power voltage. In particular, in embodiments of the present invention where the TFT SRAM cell uses high performance positive-channel TFTs having improved electrical characteristics that correspond to positive-channel bulk transistors used as load transistors of the bulk CMOS SRAM cell, the TFT SRAM cell may have advantages in terms of integration density and latch-up immunity relative to the bulk CMOS SRAM cell.

In some embodiments of the present invention, the TFT is provided at a region pattern including a single crystalline semiconductor layer to provide high performance positive-channel TFTs. Furthermore, ohmic contacts may be provided at the first and second nodes N1 and N2 illustrated in FIG. 1. As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

As illustrated in FIG. 1, the first driver transistor TD1, the first transfer transistor TT1 and the first load transistor TL1 constitute a first half-cell H1, and the second driver transistor TD2, the second transfer transistor TT2 and the second load transistor TL2 constitute a second half-cell H2.

Figure 2:
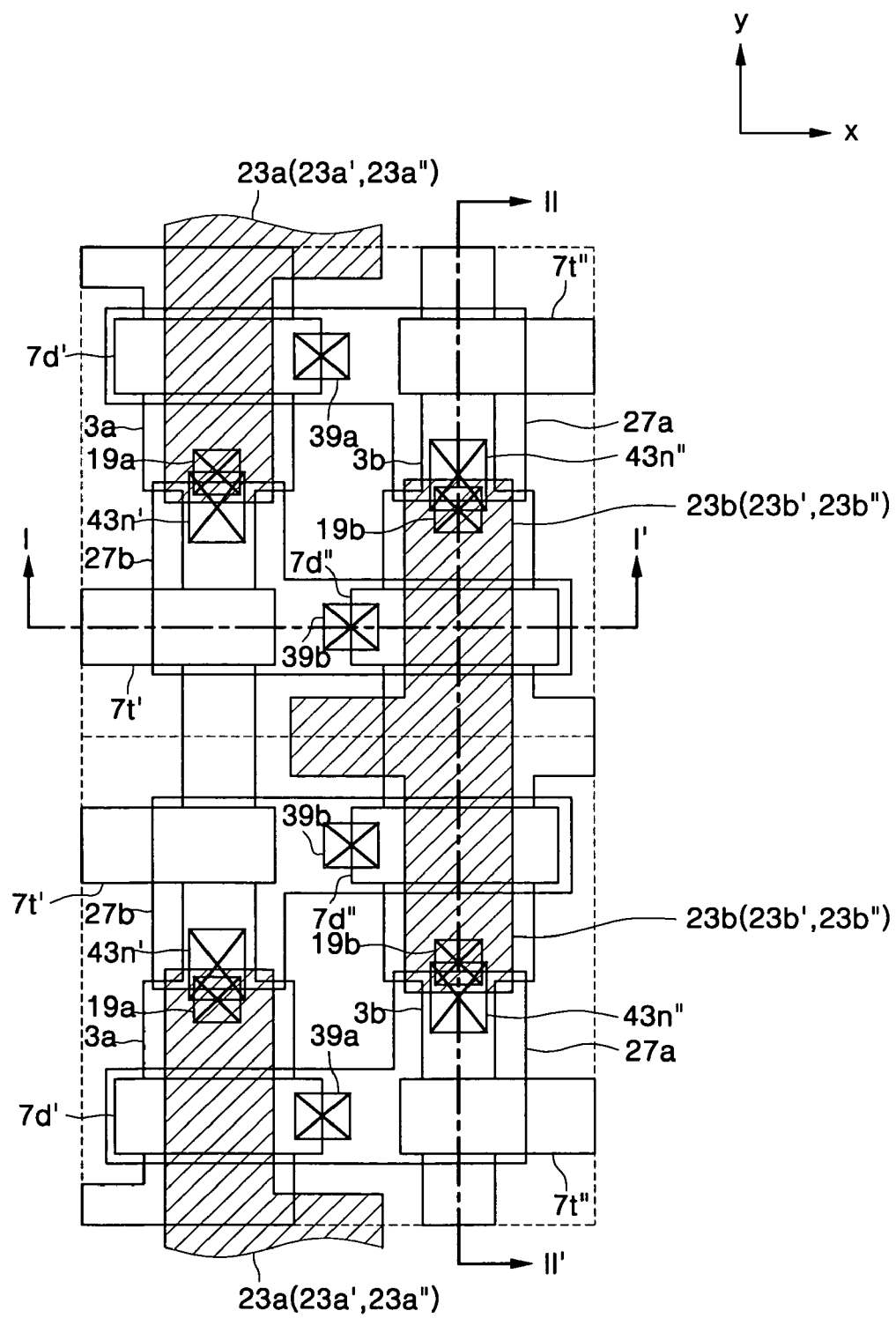
FIG. 2 is a plan view illustrating thin film transistor (TFT) CMOS SRAM cells according to some embodiments of the present invention.
Figure 3A:
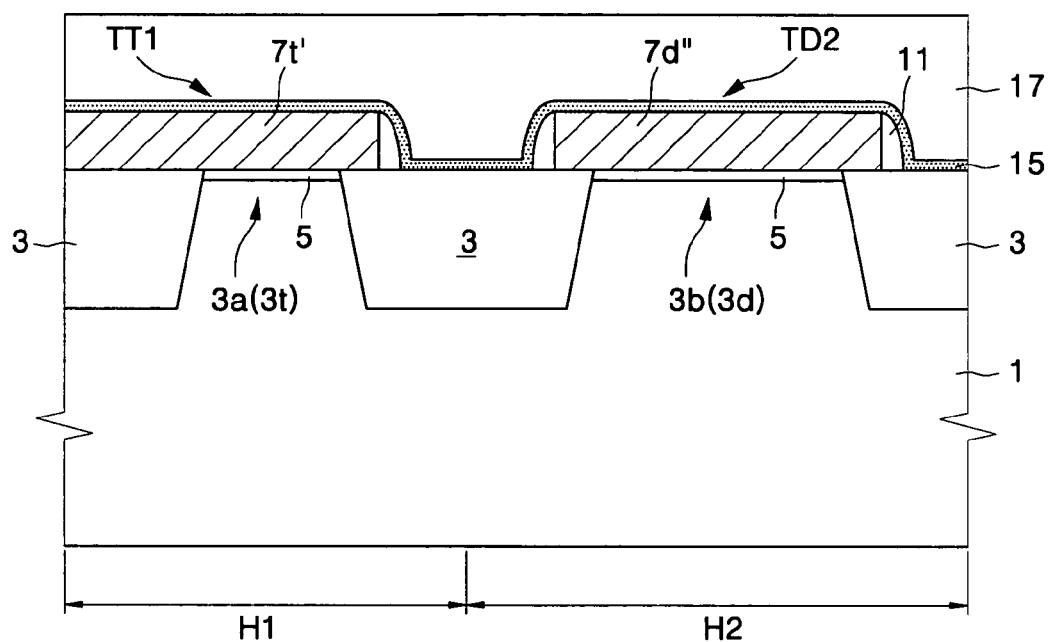
Figure 3B:
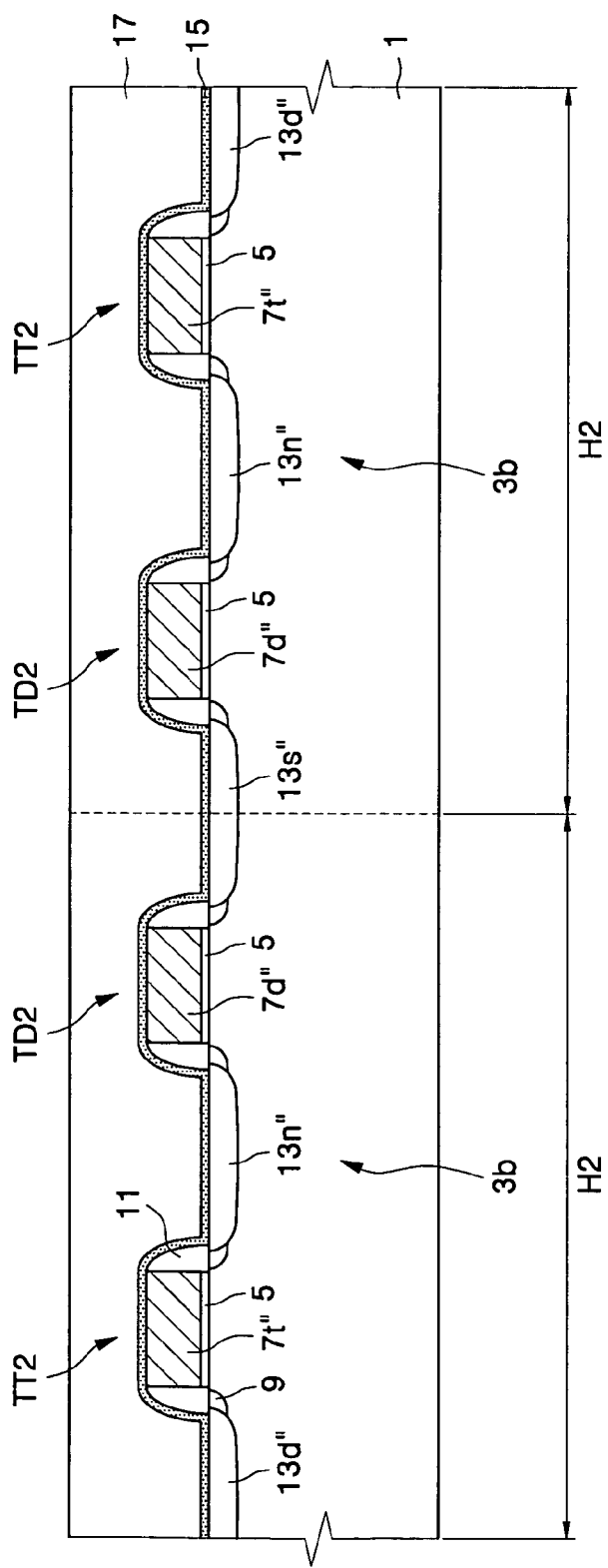

Referring now to FIG. 2, a plan view illustrating a pair of TFT SRAM cells according to some embodiments of the present invention will be discussed. As illustrated in FIG. 2, the pair of TFT SRAM cells is symmetric with each other to an x-axis. The pair of TFT SRAM cells is two dimensionally arrayed to be symmetric to the x-axis and a y-axis, thereby constituting a cell array region. Each of the pair of TFT SRAM cells illustrated in FIG. 2 is a layout of a CMOS SRAM cell corresponding to the equivalent circuit according to embodiments of the present invention illustrated in FIG. 1.

FIGS. 3A through 8A are cross sections taken along line I-I' of FIG. 2 illustrating processing steps in the fabrication of TFT SRAM cells according to some embodiments of the present invention. FIGS. 3B through 8B are cross sections taken along line II-II' of FIG. 2 illustrating processing steps in the fabrication of TFT SRAM cells according to some embodiments of the present invention. In other words, FIGS. 3A through 8A are cross sections traversing first and second half-cell regions H1 and H2 adjacent to each other, and FIGS. 3B through 8B are cross sections traversing a pair of second half-cell regions H2 adjacent to each other.

Referring now to FIGS. 1, 2, 3A and 3B, an isolation layer 3 is in a semiconductor substrate 1. In some embodiments of the present invention, the substrate may be a single crystalline semiconductor substrate, such as a single crystalline silicon substrate. The isolation layer 3 defines first and second active regions 3a and 3b in the first and second half-cell regions H1 and H2, respectively. Each of the first and second active regions 3a and 3b may include a transfer transistor region 3t and a driver transistor active region 3d. A gate insulating layer 5 is formed on the first and second active regions 3a and 3b, and a gate conductive layer is formed on the substrate 1 including the gate insulating layer 5. The gate conductive layer is patterned to form a first driver gate electrode 7d' and a first transfer gate electrode 7t' that cross over the first active region 3a as well as a second driver gate electrode 7d" and a second transfer gate electrode 7t" that cross over the second active region 3b.

The first driver gate electrode 7d' and the first transfer gate electrode 7t' are formed to cross over the driver transistor active region 3d and transfer transistor active region 3t, respectively, of the first active region 3a. Similarly, the second driver gate electrode 7d" and the second transfer gate electrode 7t" are formed to cross over the driver transistor active region 3d and transfer transistor active region 3t, respectively, of the second active region 3b.

Impurity ions of a first conductivity type are implanted into the active regions 3a and 3b using, for example, the transfer gate electrodes 7t' and 7t" and the driver gate electrodes 7d' and 7d", as ion implantation masks to provide lightly-doped drain (LDD) regions 9. The impurity ions of the first conductivity type may be, for example, N-type impurity ions. Gate spacers 11 are formed on sidewalls of the transfer and driver gate electrodes 7t', 7t", 7d' and 7d". The impurity ions of the first conductivity type are implanted into the active regions 3a and 3b using the gate electrodes 7t', 7t'', 7d' and 7d'' and the gate spacers 11 as ion implantation masks. As a result, a first node impurity region (not shown) is formed in the first active region 3a between the first driver gate electrode 7d' and the first transfer gate electrode 7t', a first bit line impurity region (not shown) is formed in the first active region 3a that is adjacent to the first transfer gate electrode 7t' and is located opposite to the first node impurity region, and a first ground impurity region (not shown) is formed in the first active region 3a that is adjacent to the first driver gate electrode 7d' and is located opposite to the first node impurity region. Furthermore, a second node impurity region 13n'' is formed in the second active region 3b between the second driver gate electrode 7d'' and the second transfer gate electrode 7t'', a second bit line impurity region 13d'' is formed in the second active region 3b that is adjacent to the second transfer gate electrode 7t'' and is located opposite to the second node impurity region 13n'', and a second ground impurity region 13s'' is formed in the second active region 3b that is adjacent to the second driver gate electrode 7d'' and is located opposite to the second node impurity region 13n''.

In some embodiments of the present invention, the LDD regions 9 remain under the gate spacers 11. The impurity regions 13s'', 13n'' and 13d'' may be formed to have a higher carrier concentration relative to the LDD regions 9. In other words, the LDD type source and drain regions may be formed in the active regions 3a and 3b. As a result, a first transfer transistor TT1 and a first driver transistor TD1 are formed at the first active region 3a. As discussed above, the first transfer transistor TT1 and the first driver transistor TD1 are serially connected to each other. Similarly, a second transfer transistor TT2 and a second driver transistor TD2 are formed at the second active region 3b. The second transfer transistor TT2 and the second driver transistor TD2 are serially connected to each other.

An interlayer insulating layer 17 is formed on a surface of the semiconductor substrate 1 including the impurity regions 13s'', 13n'' and 13d''. The interlayer insulating layer 17 may include, for example, silicon oxide. In some embodiments of the present invention, a conformal etch stop layer 15 may be formed prior to formation of the interlayer insulating layer 17. The etch stop layer 15 may include an insulating layer having an etch selectivity with respect to the interlayer insulating layer 17. For example, the etch stop layer 15 may include silicon nitride.

Referring to FIGS. 1, 2, 4A and 4B, the interlayer insulating layer 17 and the etch stop layer 15 are patterned to form first and second node contact holes 19a and 19b that expose at least a portion of the first and second node impurity regions, respectively. A first node semiconductor plug (not shown) and a second node semiconductor plug 21b are formed in the first and second node contact holes 19a and 19b, respectively. The first and second (21b) node semiconductor plugs may be formed, for example, using a selective epitaxial growth (SEG) technique that uses the exposed node impurity regions 13n'' as seed layers. In these embodiments of the present invention, the first and second (21b) node semiconductor plugs are grown to have a crystalline phase similar to the crystalline phase of the exposed node impurity regions. For example, in some embodiments of the present invention, the semiconductor substrate 1 may be a single crystalline silicon substrate, the SEG technique may be carried out using a silicon source gas, and the first and second (21b) node semiconductor plugs may be formed to have a single crystalline silicon structure. In other words, the first and second (21b) node semiconductor plugs may be single crystalline semiconductor plugs. The first and second (21b) node semiconductor plugs may be doped with P-type impurities or N-type impurities without departing from the teachings of the present invention. In some embodiments of the present invention, the first and second (21b) node semiconductor plugs may be an intrinsic semiconductor. In some embodiments of the present invention, the first and second (21b) node semiconductor plugs may be grown to have an upper surface that is higher than an upper surface of the interlayer insulating layer 17. In these embodiments of the present invention, the first and second (21b) node semiconductor plugs may be planarized until the upper surface of the first and second (21b) node semiconductor plugs are substantially planar with the upper surface of the interlayer insulating layer 17.

A molding layer is formed on the substrate 1 including the first and second (21b) node semiconductor plugs. The molding layer may include, for example, a single insulating layer such as a silicon oxide layer. The molding layer is patterned to form a molding layer pattern 22c. The molding layer pattern defines openings 22t that expose at least a portion of the second node semiconductor plugs 21b and the interlayer insulating layer 17 adjacent to the second node semiconductor plugs 21b. In some embodiments of the present invention, the interlayer insulating layer 17 and the molding layer may be formed of the same material or similar materials. In these embodiments of the present invention, the interlayer insulating layer 17 may be additionally etched during formation of the openings 22t. Thus, depths of the openings 22t may be greater than a thickness of the molding layer, i.e., the single insulating layer and may be non-uniform throughout the semiconductor substrate 1.

Figure 4A:
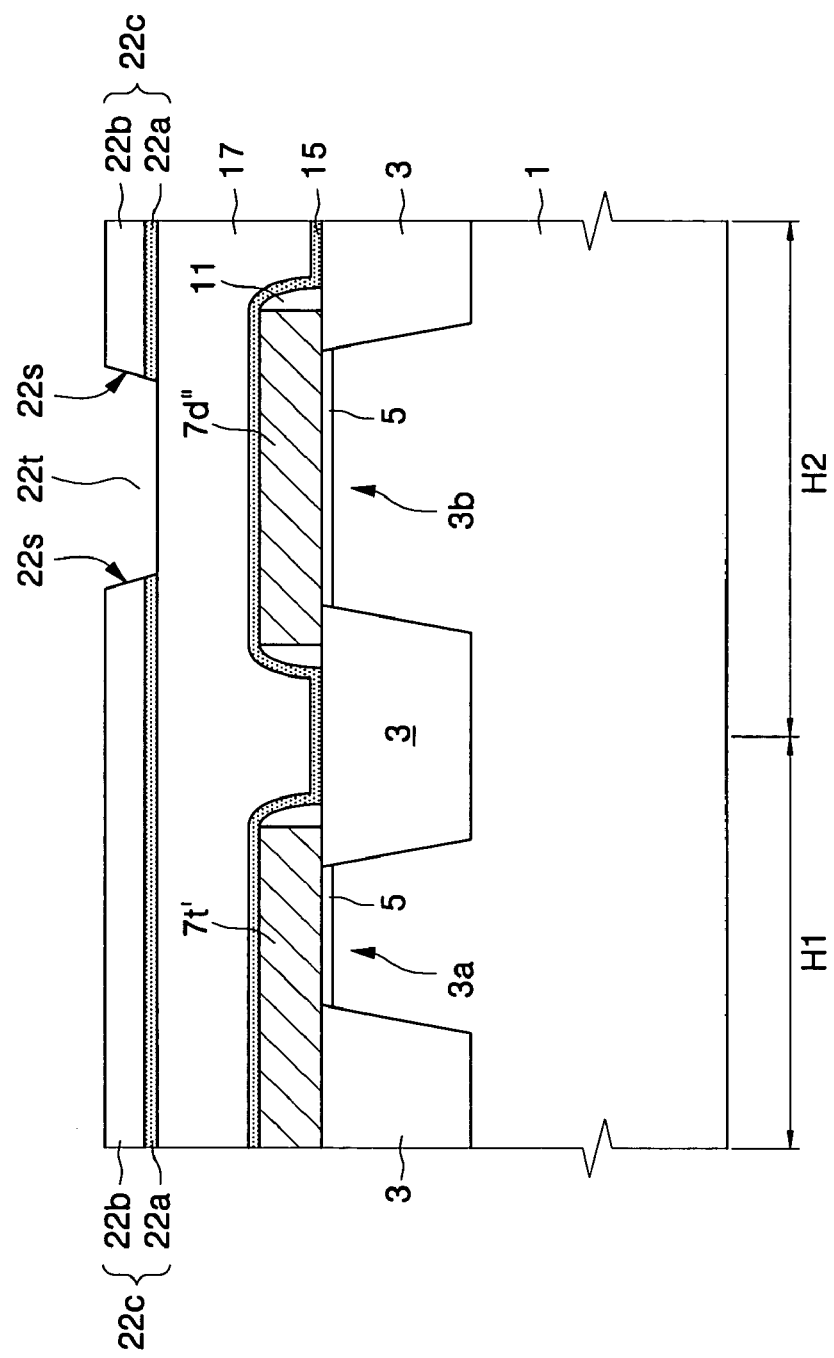

In some embodiments of the present invention, the molding layer may include, for example, a double insulating layer in order to reduce the likelihood that the openings 22t will be formed having non-uniform depths. For example, the molding layer may be formed by sequentially stacking a lower molding layer having an etch selectivity with respect to the interlayer insulating layer 17 and an upper molding layer having an etch selectivity with respect to the lower molding layer. Thus, as illustrated in FIG. 4A, the molding layer pattern 22c may include a lower molding layer pattern 22a on the interlayer insulating layer 17 and an upper molding layer pattern 22b on the lower molding layer pattern 22a. In some embodiments of the present invention, the lower molding layer may include, for example, silicon nitride and the upper molding layer may include, for example, silicon oxide. The lower molding layer may be used as an etch stop layer during a process of patterning the upper molding layer and the interlayer insulating layer 17 may be used as an etch stop layer during a process of patterning the lower molding layer. Thus, according to some embodiments of the present invention, the openings 22t may be formed to have a uniform depth, which may be substantially equal to the thickness of the molding layer pattern 22c.

In some embodiments of the present invention, regardless of whether the molding layer is formed of the single or a double insulating layer, sidewalls 22s of the openings 22t may have a positive sloped profile due to a general characteristic of an etching process for patterning the molding layer. In particular, in some embodiments of the present invention, an etching process is carried out using, for example, a photoresist pattern as an etching mask. In these embodiments of the present invention, a polymer may be generated while the molding layer is etched, and the polymer may be adsorbed into sidewalls of an etched region in the molding layer. The polymer may serve as an etching mask during the etching process. Thus, when the etching process is completed, a lower width of the opening 22t may be less than an upper width thereof. As a result, the sidewalls 22s of the openings 22t may have a positive sloped profile as discussed above.

Referring now to FIGS. 1, 2, 5A and 5B, single crystalline semiconductor epitaxial patterns 23e' are formed using, for example, a selective epitaxial growth technique that uses the second node semiconductor plugs 21b as seed layers. In some embodiments of the present invention, the single crystalline semiconductor epitaxial patterns 23e' may be grown upwardly and laterally. In embodiments of the present invention where the second node semiconductor plugs 21b are single crystalline silicon plugs, the single crystalline semiconductor epitaxial patterns 23e' may be grown using a silicon source gas. Therefore, the single crystalline semiconductor epitaxial patterns 23e' may be single crystalline silicon patterns.

During formation of the single crystalline semiconductor epitaxial patterns 23e', a first lateral growth rate A at an interface between the interlayer insulating layer 17 and the single crystalline semiconductor epitaxial patterns 23e' may be less than a second lateral growth rate B in bulk regions of the single crystalline semiconductor epitaxial patterns 23e' as the interlayer insulating layer 17 may cause a disturbance of the lateral growth of the single crystalline semiconductor epitaxial patterns 23e'. Accordingly, undercut regions may be formed under edge regions of the single crystalline semiconductor epitaxial patterns 23e'.

Figure 4B:
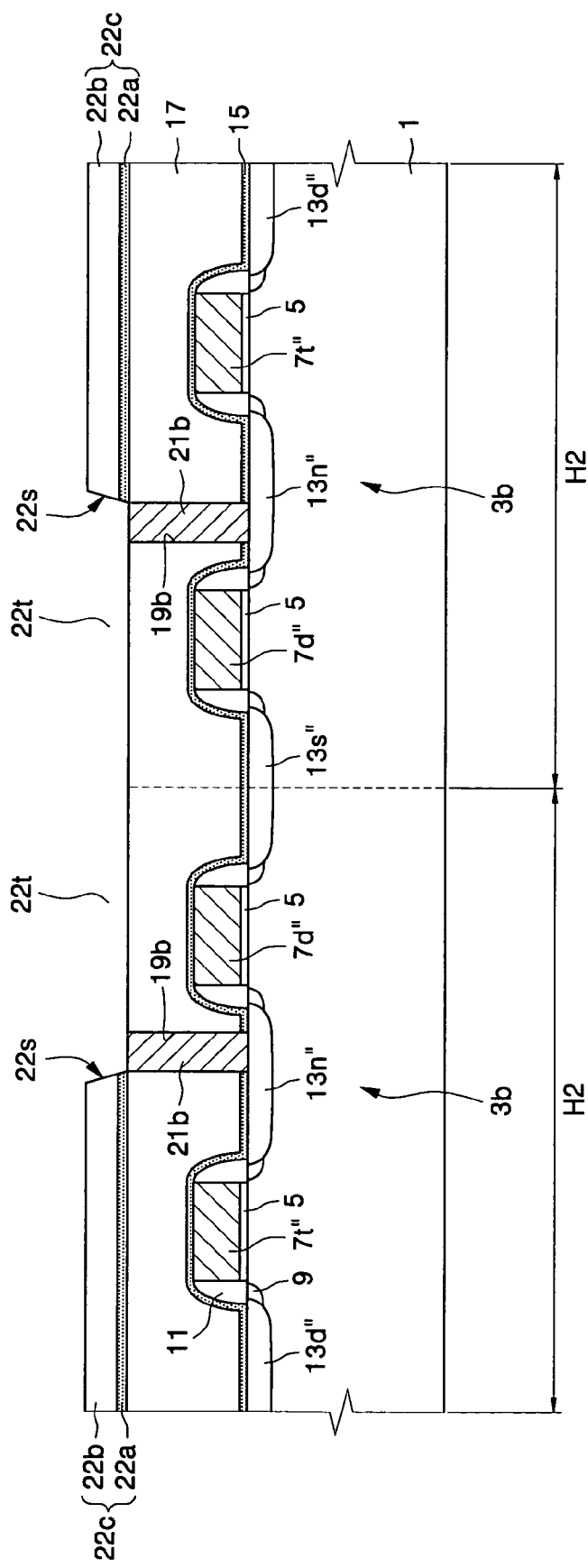
Figure 5B:
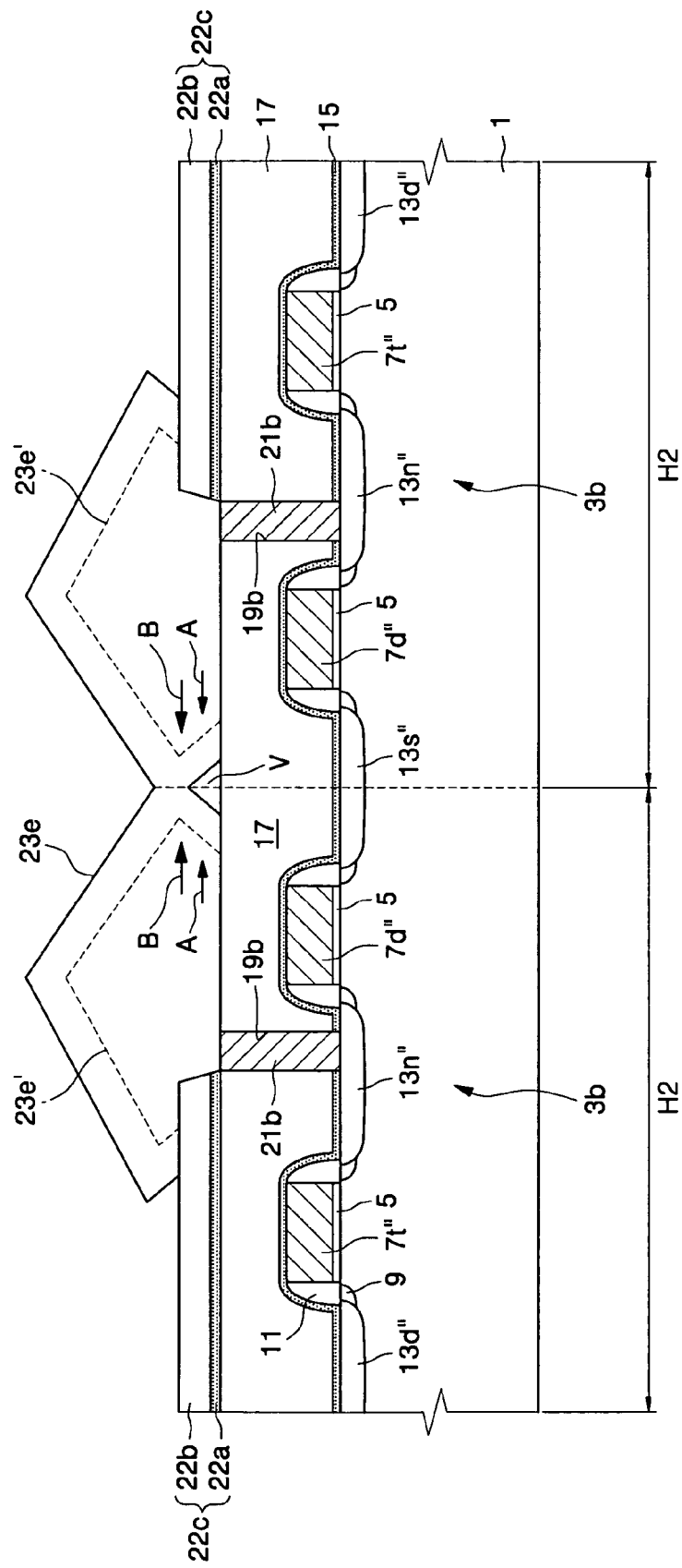

During formation of the pair of second node semiconductor plugs 21b that are formed to be adjacent to each other and the pair of openings 22t formed to expose the adjacent second node semiconductor plugs 21b are connected to each other as shown in FIG. 4B, the pair of single crystalline semiconductor epitaxial patterns 23e' formed using the pair of second node semiconductor plugs 21b as seed layers may be continuously grown to contact each other at an interface region between the second half-cell regions H2. As a result, a merged single crystalline semiconductor epitaxial pattern 23e may be provided in the pair of openings 22t. In some embodiments of the present invention, a void V may be formed at the interface region between the second half-cell regions H2 due to a difference between the first and second lateral growth rates A and B of the single crystalline semiconductor epitaxial patterns 23e'.

Figure 6A:
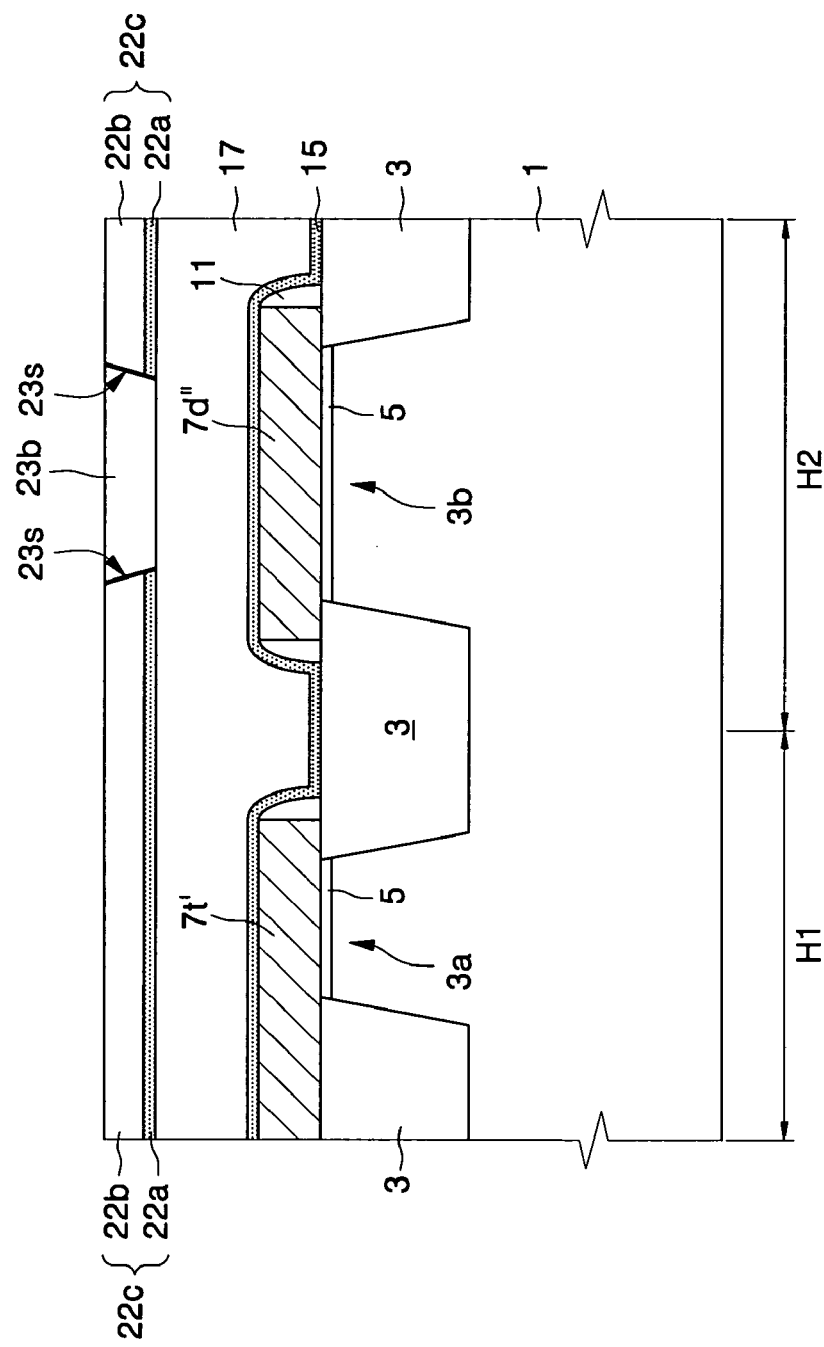
Figure 6B:
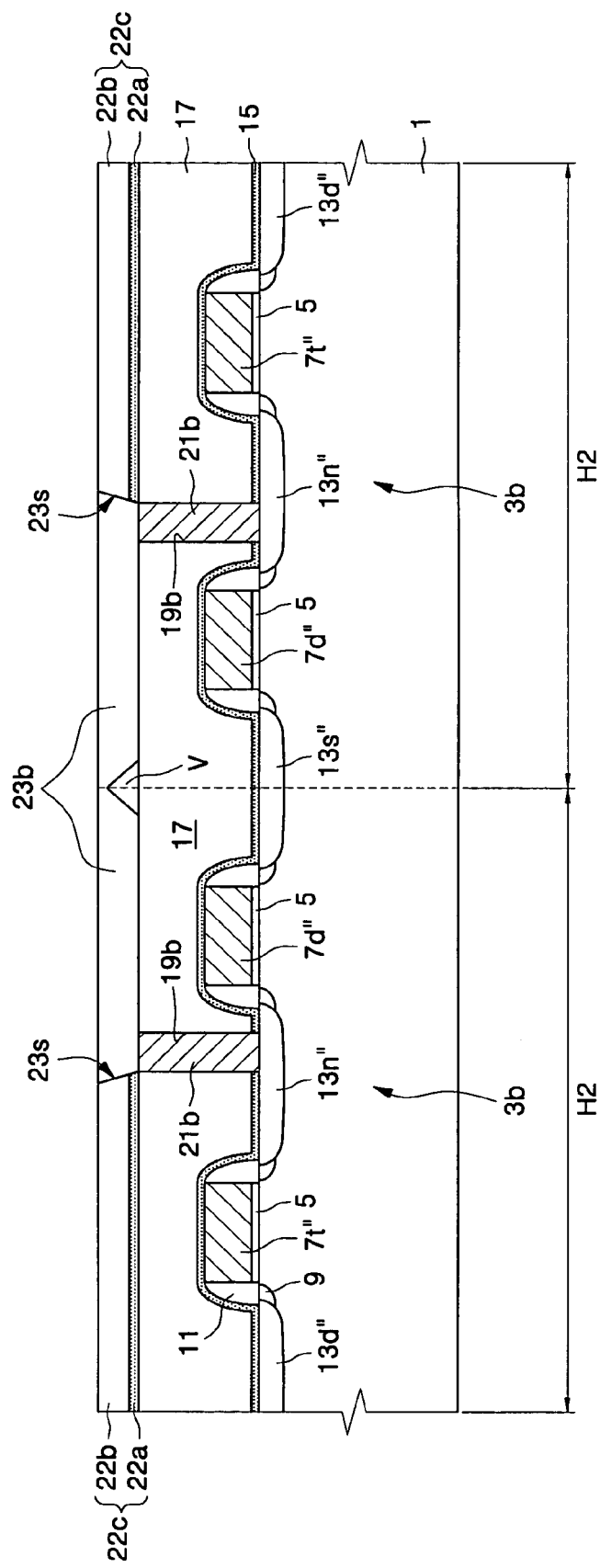
Figure 7A:
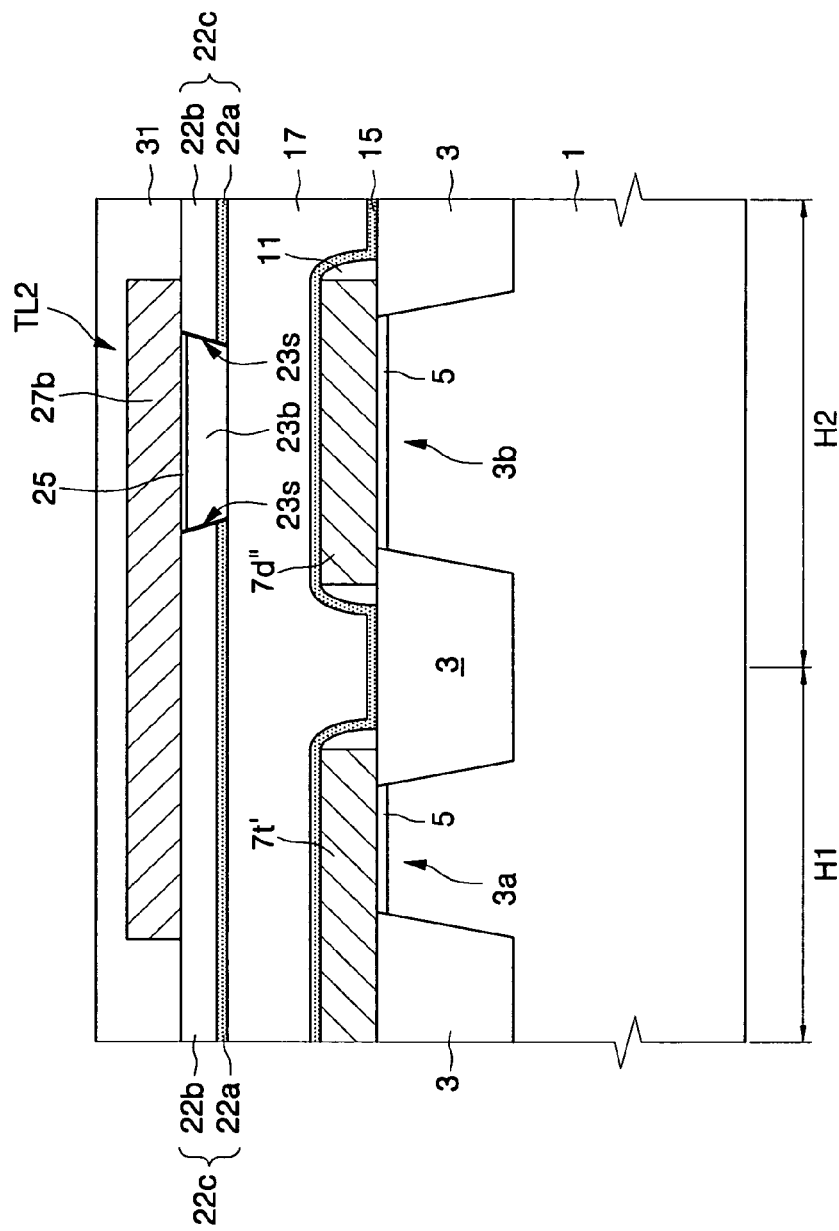
Figure 7B:
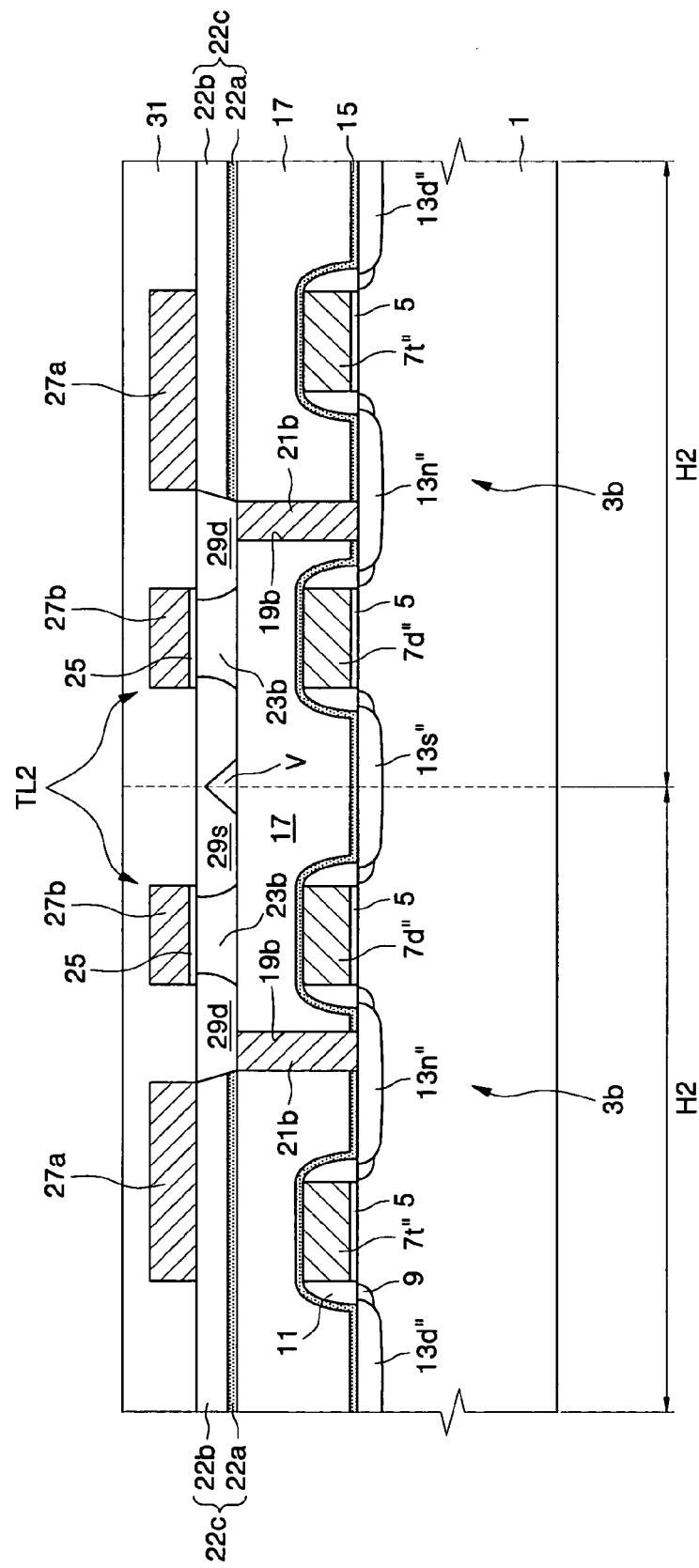
Figure 8A:
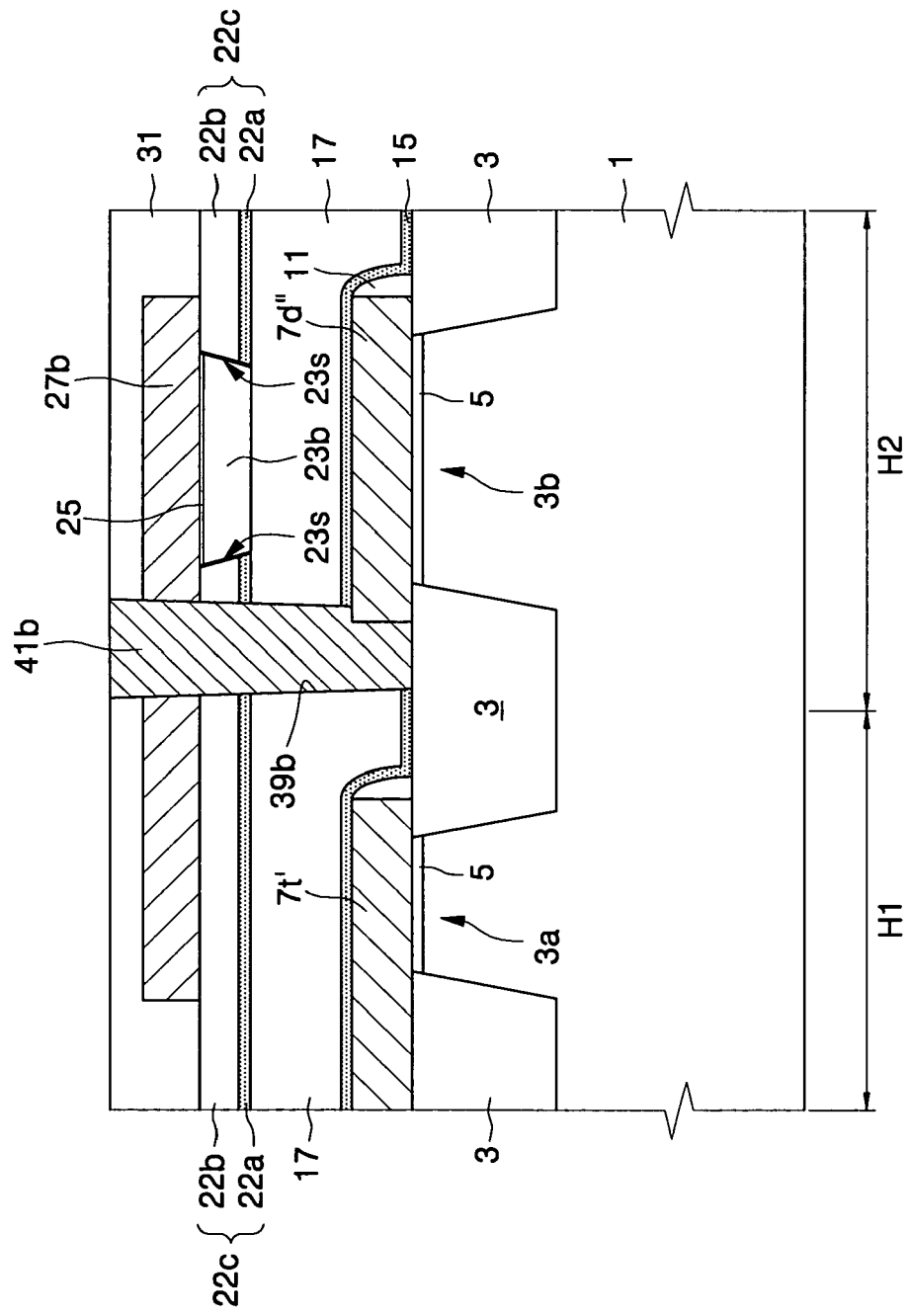
Figure 8B:
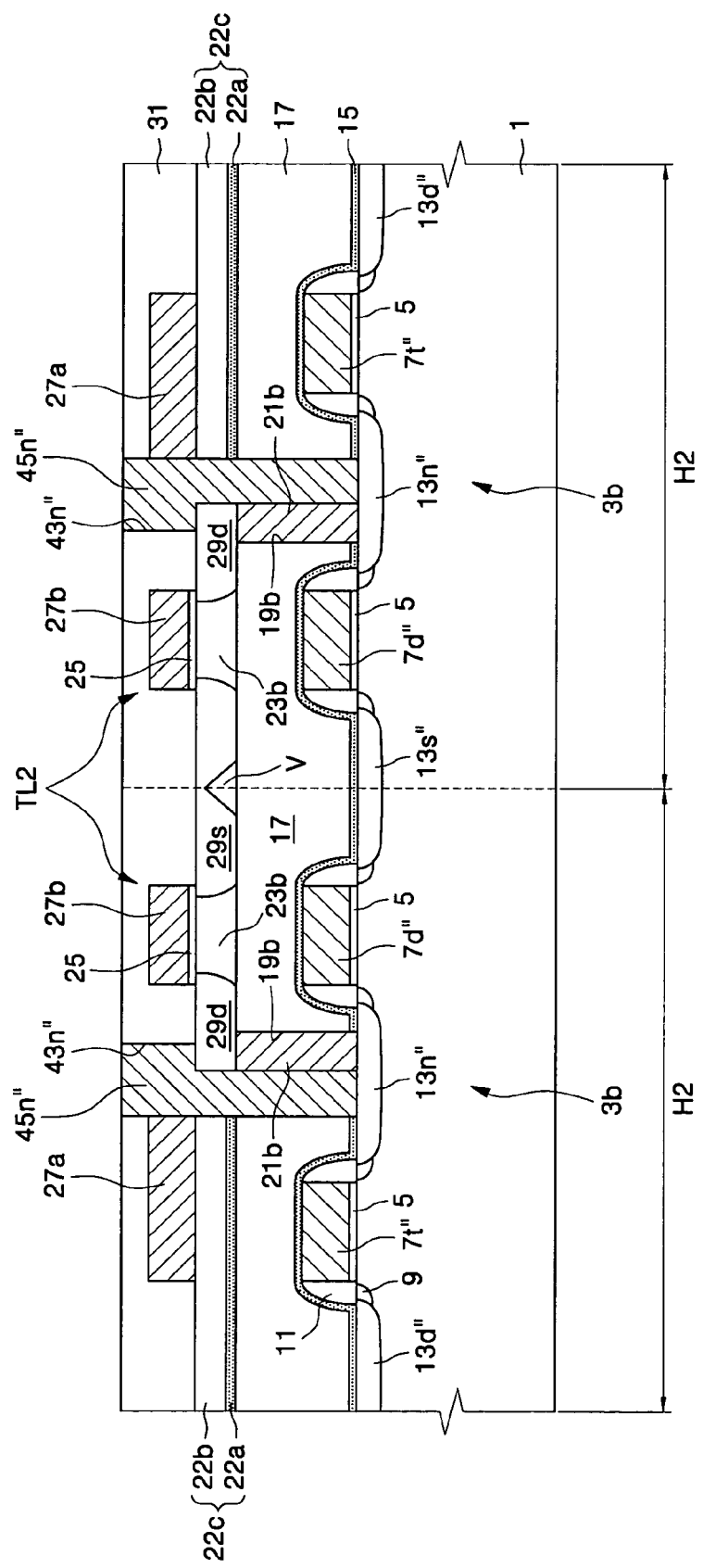

Referring now to FIGS. 1, 2, 6A and 6B, the merged single crystalline semiconductor epitaxial pattern 23e is planarized to expose at least a portion of an upper surface of the molding layer pattern 22c. The planarization of the merged single crystal semiconductor epitaxial pattern 23e may be carried out using, for example, a chemical mechanical polishing (CMP) process. As a result, single crystalline semiconductor regions 23b are formed in the openings 22t. Other single crystalline semiconductor regions 23a may be formed in the first half-cell regions H1 during formation of the single crystalline semiconductor regions 23b. As discussed above, in some embodiments of the present invention, the molding layer pattern 22c may include lower and upper molding layer patterns 22a and 22b. In these embodiments of the present invention, the single crystalline semiconductor regions 23b may be formed to have substantially the same thickness as the molding layer pattern 22c. It will be understood that the void V may still remain between the single crystalline semiconductor regions 23b as illustrated in FIG. 6B.

In some embodiments of the present invention discussed above, the single crystalline semiconductor regions 23b may be formed to have negative sloped sidewalls 23s, i.e., an upper width of the respective single crystalline semiconductor regions 23b may be greater than a lower width thereof due to the sidewalls 22s of the molding layer pattern 22c having a positive sloped profile as discussed above.

Referring now to FIGS. 1, 2, 7A and 7B, a gate insulating layer 25 is formed on the single crystalline semiconductor regions 23b. A gate conductive layer is formed on the substrate 1 including the gate insulating layer 25. The gate conductive layer is patterned to form gate electrodes, i.e., load gate electrodes 27b that cross over the single crystalline semiconductor regions 23b. Other load gate electrodes 27a may be formed in the first half-cell regions H1 adjacent to the second half-cell regions H2 during formation of the load gate electrodes 27b. The load gate electrodes 27a in the first half-cell regions H1 may extend to be adjacent to the second node semiconductor plugs 21b in the second half-cell regions H2. Similarly, the load gate electrodes 27b in the second half-cell regions H2 may also extend to be adjacent to the first node semiconductor plugs (not shown) in the first half-cell regions H1.

Impurity ions are implanted into the single crystalline semiconductor regions 23b using the load gate electrodes 27b as ion implantation masks, thereby forming source regions 29s and drain regions 29d. The drain regions 29d are formed in the single crystalline semiconductor regions 23b on the node semiconductor plugs 21b, while the source regions 29s are formed in the single crystalline semiconductor regions 23b between the load gate electrodes 27b. As a result, a pair of load TFTs TL2 may be formed in the second half-cell regions H2. During formation of the pair of load TFTs TL2, a pair of other load TFTs TL1 may be formed in the first half-cell regions H1.

Each of the load TFTs TL2 includes the load gate electrode 27b as well as the drain region 29d and the source region 29s, which are located at both sides of the load gate electrode 27b. A second interlayer insulating layer 31 is formed on the substrate 1 including the load TFTs TL2.

Referring now to FIGS. 1, 2, 8A and 8B, the second interlayer insulating layer 31, the load gate electrodes 27a and 27b, the molding layer pattern 22c, the interlayer insulating layer 17 and the etch stop layer 15 are etched to form first gate contact holes 39a and second gate contact holes 39b. The first gate contact holes 39a extend through the load gate electrodes 27a and expose at least a portion of the first driver gate electrodes 7d', and the second gate contact holes 39b extend through the load gate electrodes 27b and expose at least a portion of the second driver gate electrodes 7d''. Metal gate plugs 41b are formed in the first and second gate contact holes 39a and 39b. The metal gate plugs 41b may include a metal layer, for example a tungsten layer, that provides an ohmic contact to the load gate electrodes 27a and 27b as well as the driver gate electrodes 7d' and 7d''.

A second interlayer insulating layer 31, the load gate electrodes 27a and 27b, the molding layer pattern 22c, the interlayer insulating layer 17 and the etch stop layer 15 are etched to form first drain contact holes 43n' and second drain contact holes 43n''. The first drain contact holes 43n' are formed to expose at least a portion of the load gate electrodes 27b, the drain regions 29d, the first node semiconductor plugs and the first node impurity regions in the first half-cell regions H1, and the second drain contact holes 43n'' are formed to expose at least a portion of the load gate electrodes 27a, the drain regions 29d, the second node semiconductor plugs 21b and the second node impurity regions 13n'' in the second half-cell regions H2. Metal drain plugs 45n" are formed in the first and second drain contact holes 43n' and 43n". The metal drain plug 45n" may include a metal layer, for example a tungsten layer, that provides an ohmic contact to the load gate electrodes 27a and 27b, the drain regions 29d, the second node semiconductor plugs 21b and the node impurity regions 13n". In some embodiments of the present invention, the metal drain plugs 45n" may be formed prior to formation of the metal gate plugs 41b without departing from the scope of the present invention.

Figure 10B:
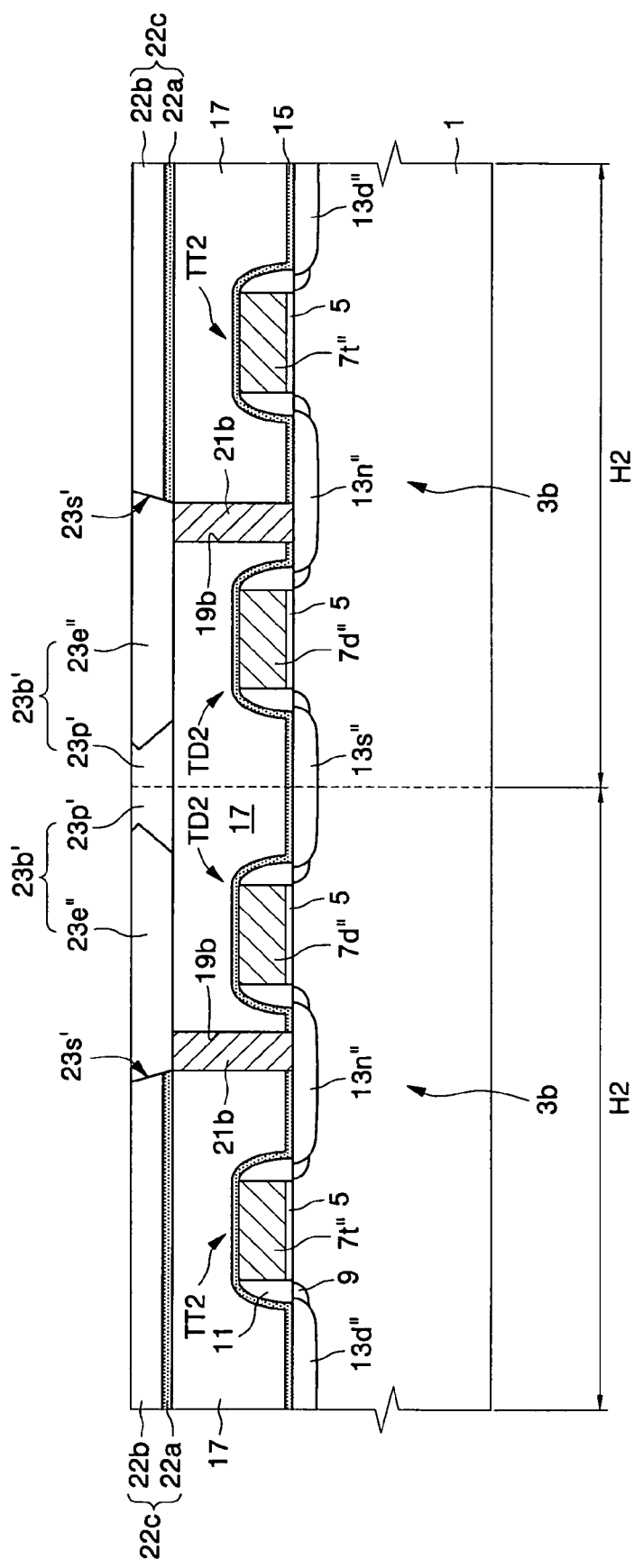

FIGS. 9A and 10A are cross sections taken along line I-I' of FIG. 2 illustrating processing steps in the fabrication of TFT SRAM cells according to further embodiments of the present invention. FIGS. 9B and 10B are cross sections taken along line II-II' of FIG. 2 illustrating processing steps in the fabrication of TFT SRAM cells according to further embodiments of the present invention.

Referring now to FIGS. 2, 9A and 9B, like numbered elements in FIGS. 9A through 10B correspond to like numbered elements of FIGS. 3A through 8B, therefore details with respect to the like numbered elements may not be discussed in further detail herein. In particular, the first and second driver transistors TD1 and TD2, the first and second transfer transistors TL1 and TL2, the interlayer insulating layer 17, the second node semiconductor plugs 21b, the molding layer pattern 22c and the single crystalline semiconductor epitaxial patterns 23e' are formed on a semiconductor substrate 1 using the methods similar to those discussed above with respect to FIGS. 3A through 5B. In some embodiments of the present invention, the single crystalline semiconductor epitaxial patterns 23e', which are grown in the adjacent second half-cell regions H2, do not contact each other and undercut regions may be formed under the edge portions of the separated single crystalline semiconductor epitaxial patterns 23e' as discussed above.

A non-single crystalline semiconductor layer 23p, such as an amorphous or polycrystalline semiconductor layer, is formed on the substrate having the separated single crystalline semiconductor epitaxial patterns 23e'. The non-single crystalline semiconductor layer 23p may be formed using, for example, a thin film deposition technique that exhibits improved step coverage. For example, the non-single crystalline semiconductor layer 23p may be formed using, for example, a chemical vapor deposition technique or an atomic layer deposition technique. Hence, the non-single crystalline semiconductor layer 23p may be formed in the undercut regions under the edge portions of the single crystalline semiconductor epitaxial patterns 23e'. In embodiments of the present invention where the single crystalline semiconductor epitaxial patterns 23e' are single crystalline silicon patterns, the non-single crystalline semiconductor layer 23p may be formed of an amorphous or polycrystalline silicon layer.

Referring now to FIGS. 2, 10A and 10B, the non-single crystalline semiconductor layer 23p is crystallized using, for example, a typical solid phase epitaxial (SPE) technique. The single crystalline semiconductor epitaxial patterns 23e' may serve as seed layers during the SPE technique. The crystallized semiconductor layer (i.e., single crystalline semiconductor layer) and the single crystalline semiconductor epitaxial patterns 23e' are planarized to expose at least a portion of an upper surface of the molding layer pattern 22c. The planarization process may be performed using a chemical mechanical polishing technique. As a result, single crystalline semiconductor regions 23b' are provided in the openings 22t surrounded by the molding layer pattern 22c.

The SPE process may be performed after the planarization process without departing from the scope of the present invention.

During formation of the single crystalline semiconductor regions 23b', other single crystalline semiconductor regions (23a' of FIG. 2) may be formed in the first half-cell regions H1. Each of the single crystalline semiconductor regions 23a' and 23b' may be formed to have the planarized single crystalline semiconductor epitaxial pattern 23e'' and the planarized single crystalline semiconductor layer 23p' as illustrated in FIG. 10B. Furthermore, as discussed above with respect to FIGS. 6A and 6B, the single crystalline semiconductor regions 23a' and 23b' may also be formed to have sidewalls 23s' having a negative sloped profile.

Although not shown in Figures, the load TFTs (TL2 of FIGS. 7A and 7B), the metal gate plugs (41b of FIG. 8A) and the metal drain plugs (45n" of FIG. 8B) may be formed on the substrate having the single crystalline semiconductor regions 23a' and 23b' using the methods similar to those discussed above with respect to FIGS. 7A through 8B.

Figure 11A:
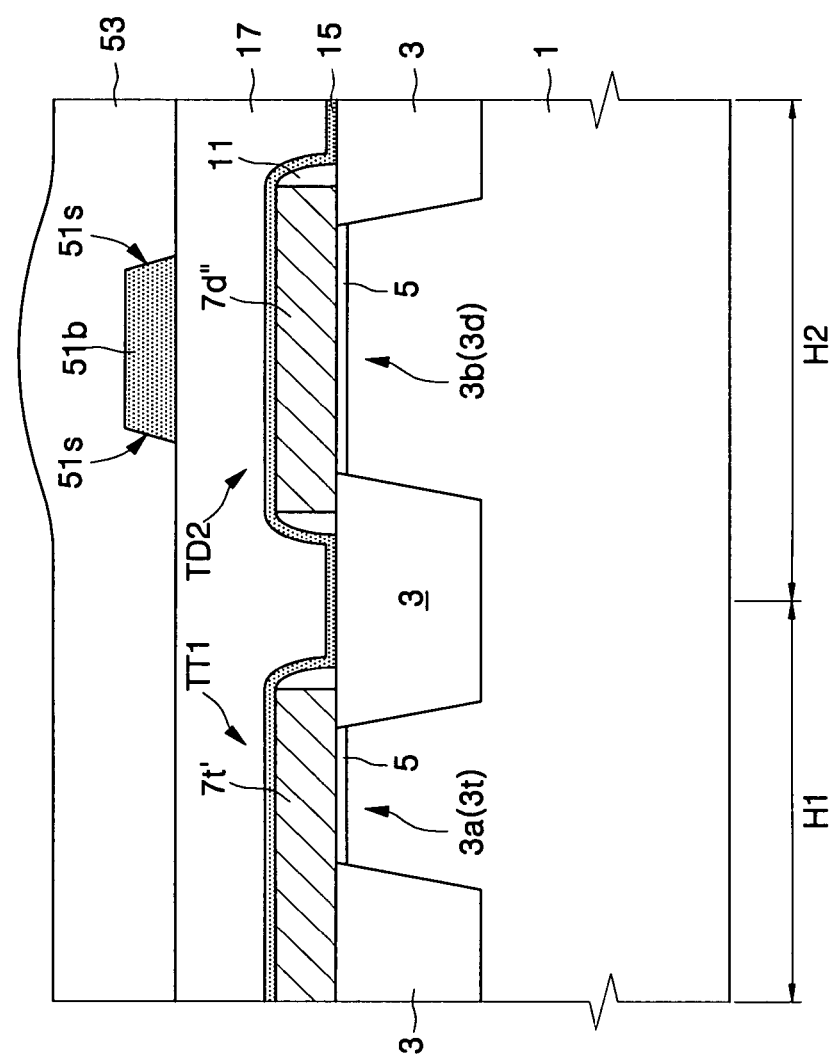
Figure 11B:
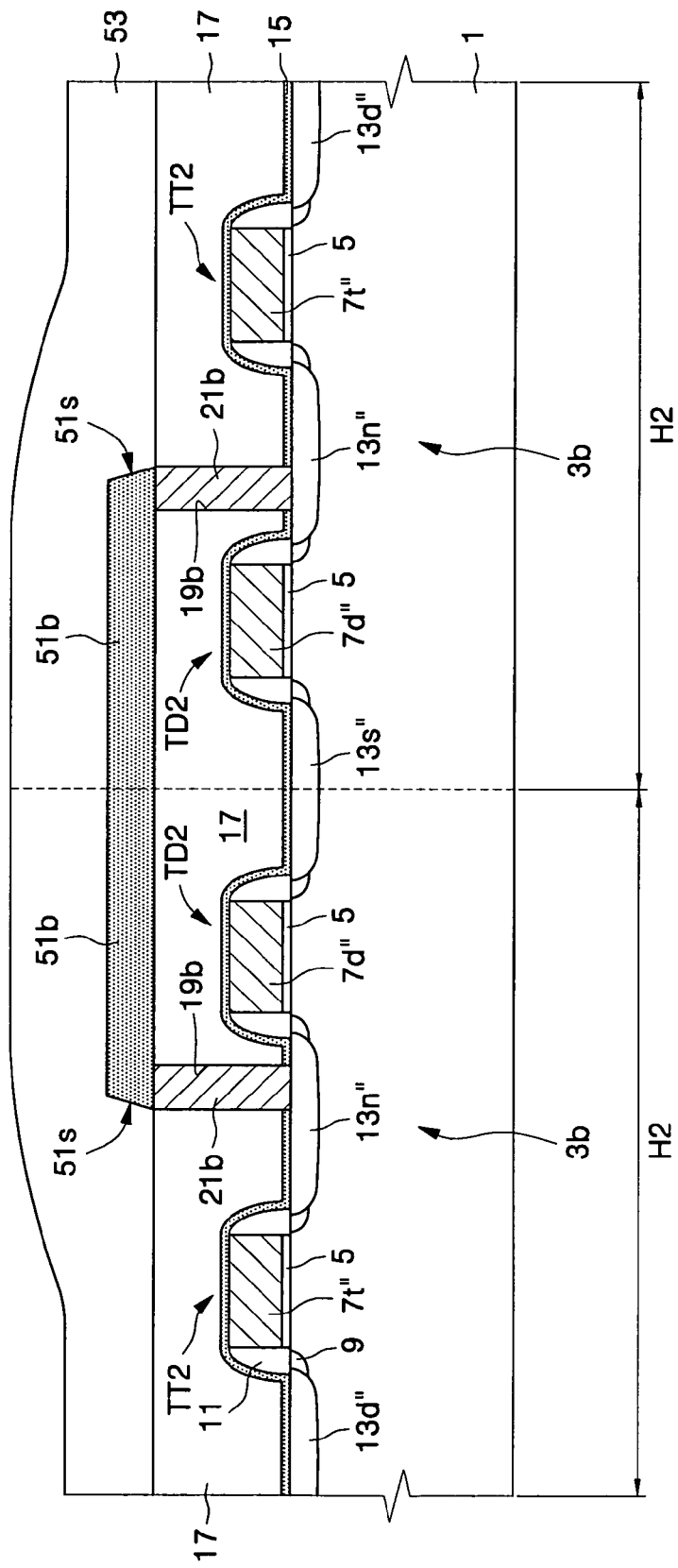
Figure 12A:
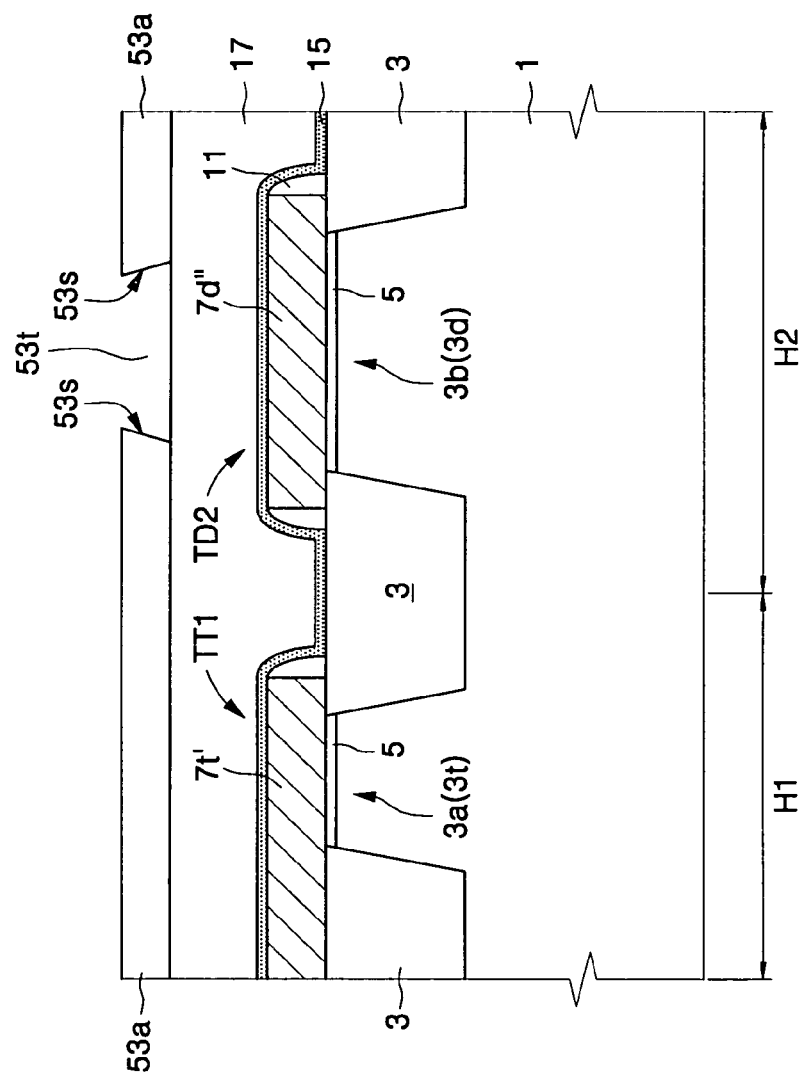
Figure 12B:
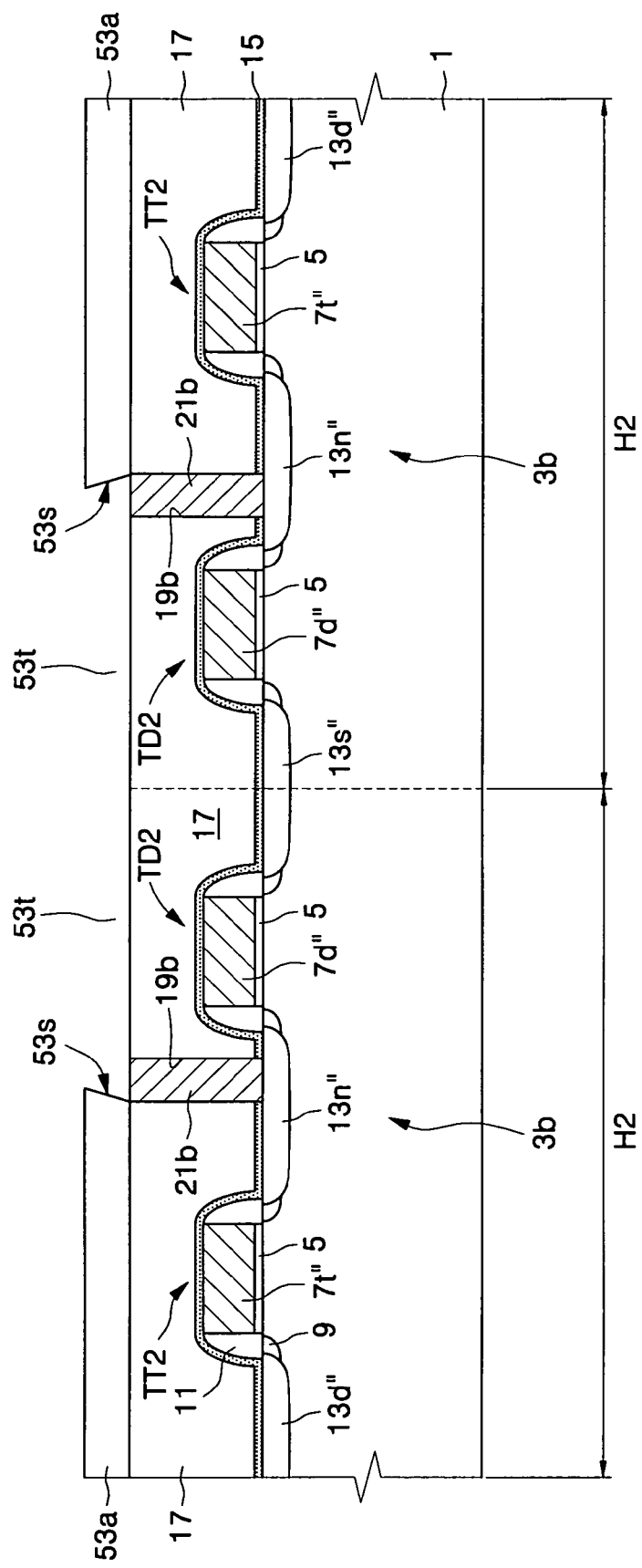
Figure 13A:
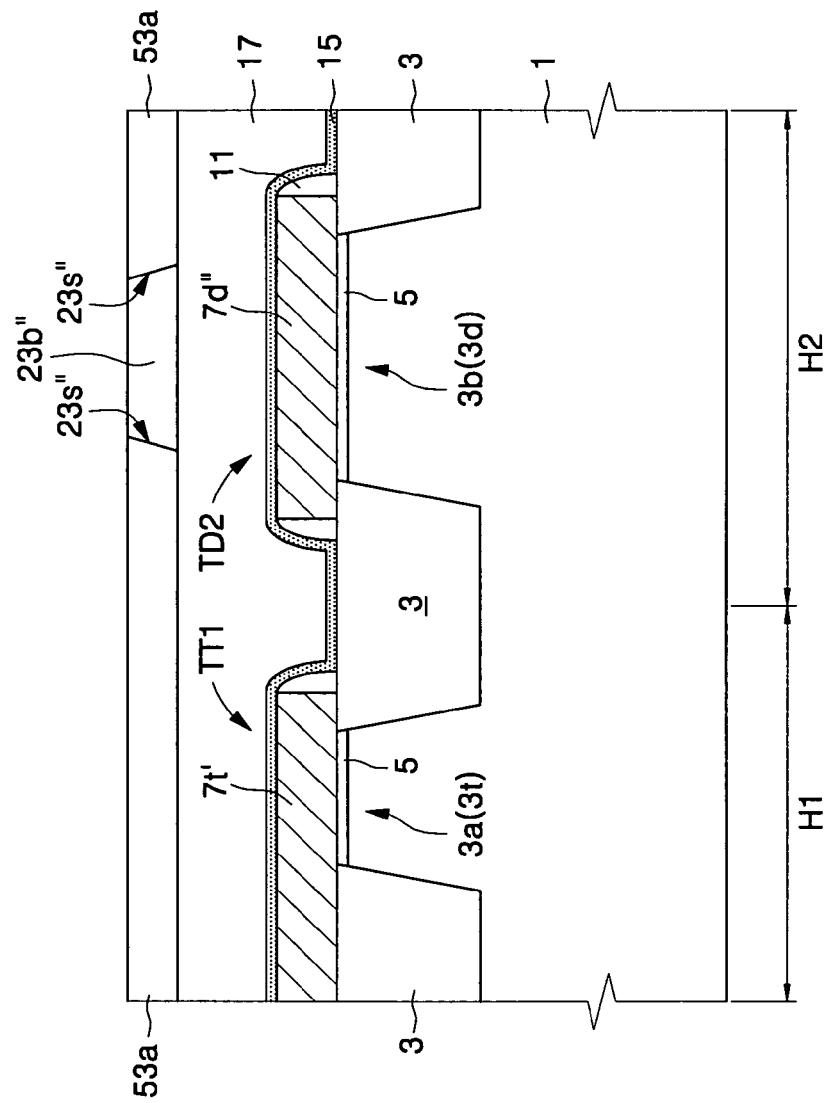
Figure 13B:
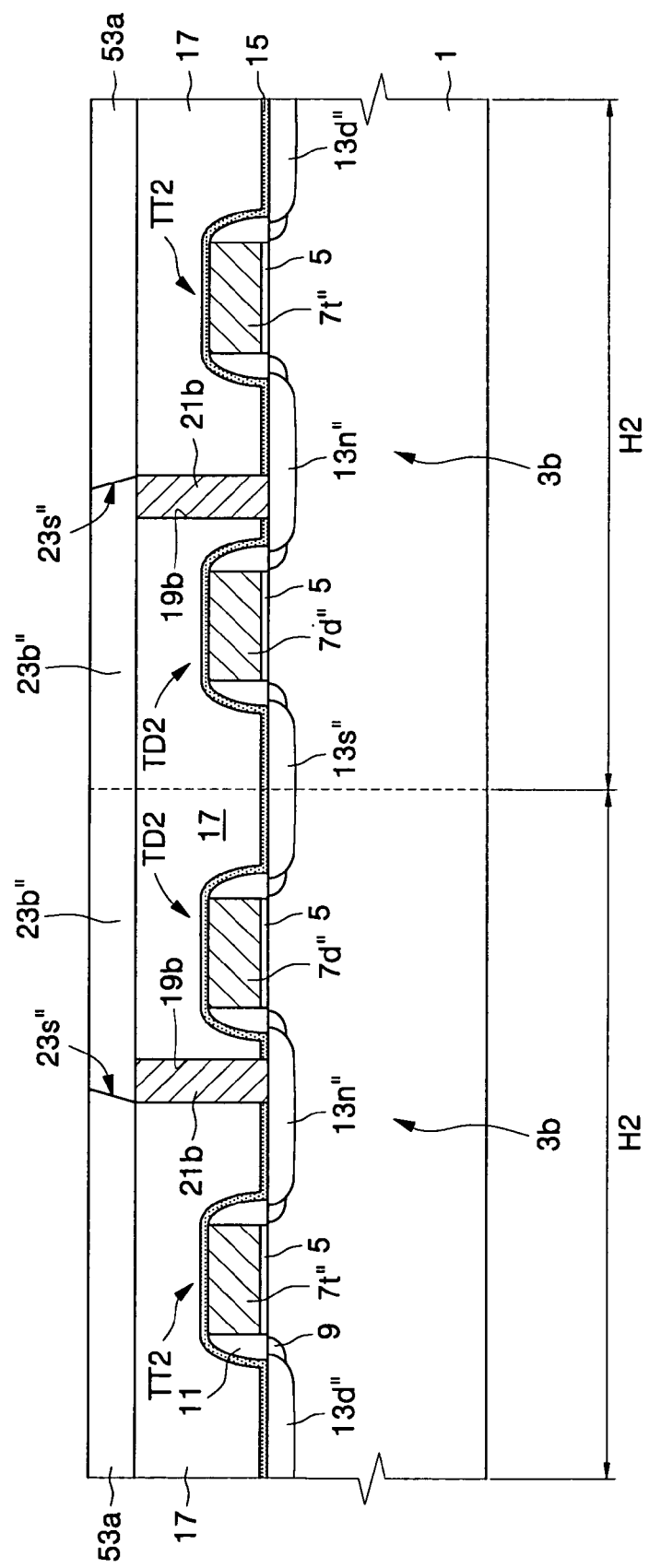

FIGS. 11A, 12A and 13A are cross sections taken along line I-I' of FIG. 2 illustrating processing steps in the fabrication of TFT SRAM cells according to some embodiments of the present invention. FIGS. 11B, 12B and 13B are cross sections taken along the line II-II' of FIG. 2 illustrating processing steps in the fabrication of TFT SRAM cells according to some embodiments of the present invention. Embodiments of the present invention discussed above with respect to FIGS. 3A through 10B use a damascene technique in order to form the single crystalline semiconductor regions 23b and 23b'. In contrast, embodiments of the present invention illustrated in FIGS. 11A through 13B use a reverse damascene technique in order to form single crystalline semiconductor regions corresponding to the single crystalline semiconductor regions 23b and 23b'.

Referring now to FIGS. 2, 11A and 11B, the first and second driver transistors TD1 and TD2, the first and second transfer transistors TL1 and TL2, the interlayer insulating layer 17 and the node semiconductor plugs 21b are formed on the semiconductor substrate 1 using methods similar to those discussed above with respect to FIGS. 3A through 4B. A sacrificial layer is formed on the substrate 1 including the second node semiconductor plugs 21b. The sacrificial layer may include, for example, a material layer having an etch selectivity with respect to the interlayer insulating layer 17. For example, in embodiments of the present invention where the interlayer insulating layer 17 includes a silicon oxide layer, the sacrificial layer may include a silicon nitride layer. The sacrificial layer is patterned using a typical photolithography/etching technique to form sacrificial layer patterns 51b covering the respective node semiconductor plugs 21b. In some embodiments of the present invention, the sacrificial layer patterns 51b may be formed to have positive sloped sidewalls 51s due to general characteristics of the etching process. In other words, an upper width of the respective sacrificial layer patterns 51b may be less than a lower width thereof. The sacrificial layer patterns 51b may be connected to each other at interface regions between the adjacent second half-cell regions H2, as illustrated in FIG. 11B.

A molding layer 53 is formed on the substrate 1 including the sacrificial layer patterns 51b. The molding layer 53 may include, for example, an insulating layer having an etch selectivity with respect to the sacrificial layer patterns 51b. For example, in embodiments of the present invention where the sacrificial layer patterns 51b are formed of silicon nitride layers, the molding layer 53 may be formed of a silicon oxide layer.

Referring now to FIGS. 2, 12A and 12B, the molding layer 53 is planarized to expose at least a portion of upper surfaces of the sacrificial layer patterns 51b. The planarization of the molding layer 53 may be carried out using, for example, a chemical mechanical polishing process. A molding layer pattern 53a surrounding sidewalls 51s of the sacrificial layer patterns 51b may be formed on the interlayer insulating layer 17, and the molding layer pattern 53a may be formed to have substantially the same thickness as the sacrificial layer patterns 51b.

The sacrificial layer patterns 51b are selectively removed to form openings 53t that expose the second node semiconductor plugs 21b. In some embodiments of the present invention, sidewalls 53s of the openings 53t may exhibit relatively negative sloped profiles. An upper width of the respective openings 53t may be less than a lower width thereof due to the sidewalls 51s of the sacrificial layer patterns 51b having the positive sloped profiles as discussed above.

Referring now to FIGS. 2, 13A and 13B, single crystalline semiconductor regions 23b'' are formed in the openings 53t using methods similar to those discussed above with respect to FIGS. 3A through 10B. During formation of the single crystalline semiconductor regions 23b'', other single crystalline semiconductor regions (23a'' of FIG. 2) may be formed in the first half-cell regions H1. In other words, each of the single crystalline semiconductor regions 23a'' and 23b'' may be formed of a planarized single crystalline semiconductor epitaxial pattern like the single crystalline semiconductor regions 23b'' of FIG. 6B or may be formed to have the planarized single crystalline semiconductor epitaxial pattern 23e'' and the planarized single crystalline semiconductor layer 23p' illustrated in FIG. 10B.

In some embodiments of the present invention, the single crystalline semiconductor regions 23a'' and 23b'' may be formed to have sidewalls 23s'' that exhibit positive sloped profiles due to the sidewalls 53s of the openings 53t having negative sloped profiles as discussed above.

Although not shown in the Figures, load TFTs (TL2 of FIGS. 7A and 7B), metal gate plugs (41b of FIG. 8A) and metal drain plugs (45n'' of FIG. 8B) may be formed on the substrate 1 including the single crystalline semiconductor regions 23a'' and 23b'' using the methods similar to those discussed above with respect to FIGS. 7A through 8B.

According to some embodiments of the present invention, the likelihood that the interlayer insulating layer 17 will be over-etched during formation of the openings 53t may be reduced. Thus, the single crystalline semiconductor regions 23a'' and 23b'' may be formed to a uniform thickness without use of the lower molding layer pattern 22a discussed above with respect to FIGS. 4A and 4B. Therefore, when contact holes passing through the interlayer insulating layers 17 and 31 are formed, it may be possible to reduce the likelihood that contact holes will be formed to have an abnormal sidewall profile.

It will be understood that although embodiments of the present invention are discussed above with respect to TFT SRAM cells, embodiments of the present invention are not limited to this configuration and may be applied to various other semiconductor devices. For example, the present invention may be applied to a three dimensional CMOS SRAM cell having doubled stacked TFTs, for example, as illustrated in FIG. 14.

Figure 14:
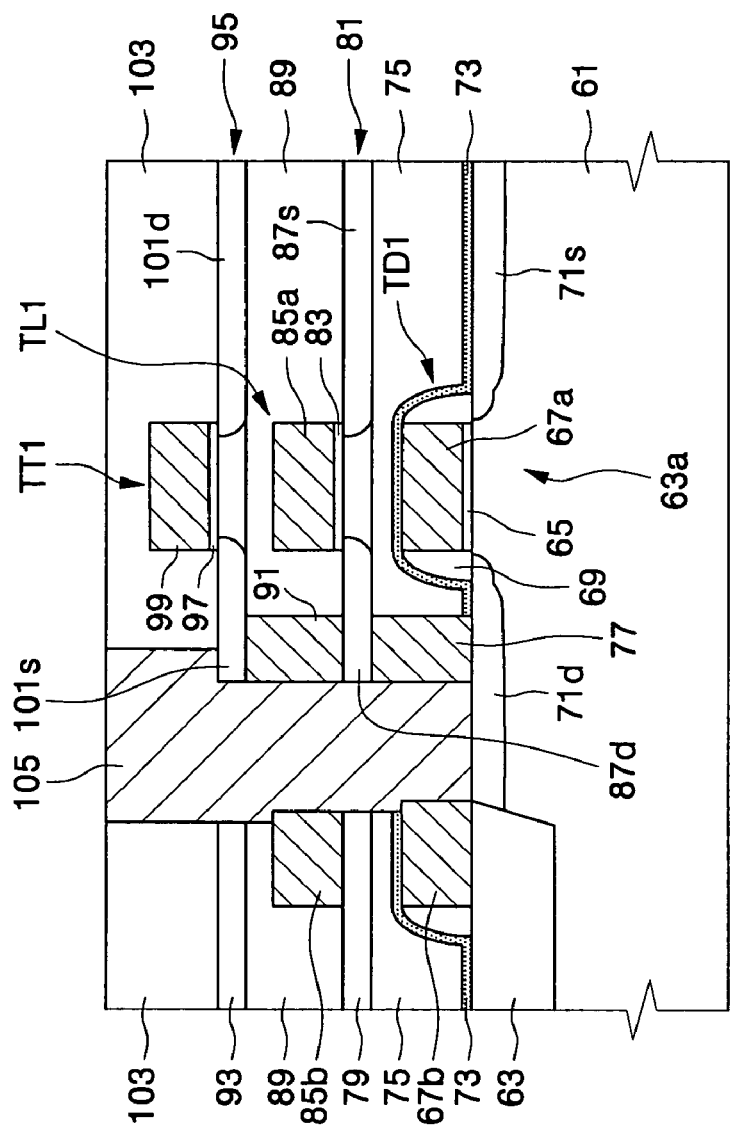
FIG. 14 is a cross section illustrating a half-cell of TFT CMOS SRAM cells according to some embodiments of the present invention.

Referring now to FIG. 14, a cross section illustrating a first half-cell of a CMOS SRAM cell having a pair of bulk MOS transistors, a pair of load TFTs and a pair of transfer TFTs will be discussed. As illustrated in FIG. 14, an isolation layer 63 is provided on a semiconductor substrate 61 to define an active region 63a. A first driver transistor TD1 is provided at the active region 63a. The first driver transistor TD1 has a source region 71s and a drain region 71d formed in the active region 63a as well as a first driver gate electrode 67a crossing over a channel region between the source and drain regions 71s and 71d. In addition, a second driver transistor (not shown) may be formed in a second half-cell region adjacent to the first half-cell region. A second driver gate electrode 67b of the second driver transistor may extend onto the isolation layer 63, which is adjacent to the drain region 71d in the first half-cell region.

The first driver gate electrode 67a is insulated from the active region 63a by a gate insulating layer 65. Spacers 69 may be provided on sidewalls 65 of the first and second driver gate electrodes 67a and 67b. An etch stop layer 73 is provided on the substrate 61 including the driver transistors and an interlayer insulating layer 75 is stacked on the etch stop layer 73. The drain region 71d contacts a node semiconductor plug 77 that has a single crystalline structure and extends through the interlayer insulating layer 75 and the etch stop layer 73. The node semiconductor plug 77 may be fabricated using methods similar to those discussed above with respect to FIG. 4B.

A molding layer pattern 79 is provided on the interlayer insulating layer 75. The molding layer pattern 79 may be formed to have an opening that exposes at least a portion of the node semiconductor plug 77 and the interlayer insulating layer 75 adjacent to the node semiconductor plug 77. In some embodiments of the present invention, the molding layer pattern 79 may be fabricated using methods similar to those discussed above with respect to FIGS. 4A and 4B. In further embodiments of the present invention, the molding layer pattern 79 may be formed using methods similar to those discussed above with respect to FIGS. 11A through 12B.

A single crystalline semiconductor region 81 is provided in the opening. The single crystalline semiconductor region 81 may be formed using, for example, methods similar to those discussed above with respect to forming the single crystalline semiconductor regions 23b of FIGS. 6A and 6B. In further embodiments of the present invention, the single crystalline semiconductor region 81 may be formed using methods similar to those discussed above with respect to forming the single crystalline semiconductor regions 23b' of FIGS. 10A and 10B.

A first load thin film transistor (TFT) TL1 is provided at the single crystalline semiconductor region 81. The first load TFT TL1 is formed to have a first load gate electrode 85a, a drain region 87d and a source region 87s. The first load gate electrode 85a is formed to cross over the single crystalline semiconductor region 81, the drain region 87d is formed in the single crystalline semiconductor region 81 that is adjacent to the first load gate electrode 85a and located on the single crystalline semiconductor plug 77, and the source region 87s is in the single crystalline semiconductor region 81 that is adjacent to the first load gate electrode 85a and located opposite to the drain region 87d. The first load gate electrode 85a is insulated from the single crystalline semiconductor region 81 by a gate insulating layer 83. In addition, a second load TFT (not shown) may be formed in a second half-cell region adjacent to the first half-cell region.

A second load gate electrode 85b of the second load TFT may extend to be adjacent to the drain region 87d in the first half-cell region.

A second interlayer insulating layer 89 is provided on the substrate 61 including the first and second load TFTs. The drain region 87d contacts a second node semiconductor plug 91 that extends through the second interlayer insulating layer 89. The second node semiconductor plug 91 may be formed using methods similar to those discussed above with respect to forming the node semiconductor plugs 21b of FIG. 4B.

A second molding layer pattern 93 is provided on the second interlayer insulating layer 89. The second molding layer pattern 93 may define a second opening that exposes at least a portion of the second node semiconductor plug 91 and the second interlayer insulating layer 89 adjacent to the second node semiconductor plug 91. The second molding layer pattern 93 may be formed using methods similar to those discussed above with respect to forming the molding layer pattern 22c of FIGS. 4A and 4B. The second molding layer pattern 93 may be formed using methods similar to those discussed above with respect to forming the molding layer pattern 53a, which are described with reference to FIGS. 11A through 12B.

A second single crystalline semiconductor region 95 is formed in the second opening that exposes at least a portion of the second node semiconductor plug 91. The second single crystalline semiconductor region 95 may be formed using methods similar to those discussed above with respect to forming the single crystalline semiconductor regions 23b of FIGS. 6A and 6B. In further embodiments of the present invention, the second single crystalline semiconductor region 95 may be formed using methods similar to those discussed above for forming the single crystalline semiconductor regions 23b' of FIGS. 10A and 10B.

A first transfer TFT TL1 is provided at the second single crystalline semiconductor region 95. The first transfer TFT TT1 is formed to have a word line 99, a source region 101s and a drain region 101d. The word line 99 is formed to cross over the second single crystalline semiconductor region 95, the source region 101s is formed in the second single crystalline semiconductor region 95 that is adjacent to the word line 99 and located on the second single crystalline semiconductor plug 91, and the drain region 101d is formed in the second single crystalline semiconductor region 95 that is adjacent to the word line 99 and located opposite to the source region 101s. Furthermore, the word line 99 is insulated from the second single crystalline semiconductor region 95 by a gate insulating layer 97. In addition, a second transfer TFT (not shown) may be formed in the second half-cell region adjacent to the first half-cell region. The word line 99 may extend to serve as a gate electrode of the second transfer TFT.

A third interlayer insulating layer 103 is provided on the substrate 61 including the first and second transfer TFTs. The drain regions 71d and 87d, the node semiconductor plugs 77 and 91, the source region 101s, the second driver gate electrode 67b and the second load gate electrode 85b are electrically connected to each other through a metal node plug 105 that passes through the interlayer insulating layers 75, 89 and 103, the etch stop layer 73, and the molding layer patterns 79 and 93.

According to some embodiments of the present invention described herein, a single crystalline semiconductor plug that extends through an interlayer insulating layer is formed and a single crystalline semiconductor epitaxial pattern is grown on the interlayer insulating layer using the single crystalline semiconductor plug as a seed layer. The single crystalline semiconductor epitaxial pattern is planarized using a molding layer pattern formed on the interlayer insulating layer. As a result, a semiconductor region having a uniform thickness and an excellent single crystalline structure may be formed on the interlayer insulating layer. Therefore, when a thin film transistor is formed at the single crystalline semiconductor region, the integration density, reliability and electrical characteristics of a semiconductor device may be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a semiconductor device, the method comprising:
    forming an interlayer insulating layer on a single crystalline semiconductor substrate;
    forming a single crystalline semiconductor plug that extends through the interlayer insulating layer;
    forming a molding layer pattern on the semiconductor substrate and the single crystalline semiconductor plug, the molding layer pattern defining an opening therein that at least partially exposes a portion of the single crystalline semiconductor plug;
    forming a single crystalline semiconductor epitaxial pattern on the exposed portion of single crystalline semiconductor plug using a selective epitaxial growth technique that uses the exposed portion of the single crystalline semiconductor plug as a seed layer; and
    forming a single crystalline semiconductor region in the opening, the single crystalline semiconductor region including at least a portion of the single crystalline semiconductor epitaxial pattern.

2. The method of claim 1, wherein forming the single crystalline semiconductor plug comprises:
    patterning the interlayer insulating layer to form a contact hole therein, the contact hole exposing at least a portion of the semiconductor substrate; and
    growing a single crystalline semiconductor epitaxial layer in the contact hole using a selective epitaxial growth technique that uses the exposed portion of the single crystalline semiconductor substrate as a seed layer.

3. The method of claim 2, further comprising planarizing the single crystalline semiconductor epitaxial layer.

4. The method of claim 1, wherein forming the molding layer pattern comprises:
    forming a molding layer on the semiconductor substrate and the single crystalline semiconductor plug; and
    patterning the molding layer such that at least a portion of the single crystalline semiconductor plug is exposed through the molding layer.

5. The method of claim 4, wherein the molding layer comprises a single layer of silicon oxide.

6. The method of claim 1, wherein forming the molding layer pattern comprises:
    forming a lower molding layer on the semiconductor substrate and the single crystalline semiconductor plug;
    forming an upper molding layer on the lower molding layer; and
    patterning the upper and lower molding layers such that at least a portion of the single crystalline semiconductor plug is exposed through the upper and lower molding layers.

7. The method of claim 6, wherein the lower molding layer comprises an insulating layer having an etch selectivity with respect to the interlayer insulating layer and wherein the upper molding layer comprises an insulating layer having an etch selectivity with respect to the lower molding layer.

8. The method of claim 7, wherein the lower molding layer comprises a silicon nitride layer and wherein the upper molding layer comprises a silicon oxide layer.

9. The method of claim 1, wherein forming the molding layer pattern comprises:
   forming a sacrificial layer pattern on the semiconductor substrate and the single crystalline semiconductor plug;
   forming a molding layer on the sacrificial layer pattern and the interlayer insulating layer;
   planarizing the molding layer to expose at least a portion of an upper surface of the sacrificial layer pattern; and
   selectively removing the sacrificial layer pattern to expose at least a portion of the single crystalline semiconductor plug.

10. The method of claim 9, wherein the sacrificial layer pattern comprises a material layer having an etch selectivity with respect to both the interlayer insulating layer and the molding layer.

11. The method of claim 10, wherein the sacrificial layer pattern comprises a silicon nitride layer and wherein the molding layer comprises a silicon oxide layer.

12. The method of claim 1, wherein forming the single crystalline semiconductor region comprises planarizing the single crystalline semiconductor epitaxial pattern until at least a portion of an upper surface of the molding layer pattern is exposed.

13. The method of claim 1, wherein forming the single crystalline semiconductor region comprises:
   forming one of an amorphous semiconductor layer and a polycrystalline semiconductor layer on the substrate and the single crystalline semiconductor epitaxial pattern;
   crystallizing the one of the amorphous semiconductor layer and the polycrystalline semiconductor layer using a solid phase epitaxial technique; and
   planarizing the crystallized semiconductor layer and the single crystalline semiconductor epitaxial pattern until a top surface of the molding layer pattern is exposed.

14. The method of claim 1, wherein forming the single crystalline semiconductor region comprises:
   forming one of an amorphous semiconductor layer and a polycrystalline semiconductor layer on the semiconductor substrate and the single crystalline semiconductor epitaxial pattern;
   planarizing the one of the amorphous semiconductor layer and the polycrystalline semiconductor layer and the single crystalline semiconductor epitaxial pattern until at least a portion of an upper surface of the molding layer pattern is exposed; and
   crystallizing the one of the planarized amorphous semiconductor layer and the planarized polycrystalline semiconductor layer using a solid phase epitaxial technique.

15. The method of claim 1, further comprising forming a thin film transistor on the single crystalline semiconductor region.

16. The method of claim 15, wherein forming the thin film transistor comprises:
   forming an insulated gate electrode that crosses over the single crystalline semiconductor region; and
   implanting impurity ions into the single crystalline semiconductor region using the gate electrode as an ion implantation mask to provide source and drain regions.

17. The method of claim 1, wherein forming the interlayer insulating layer is preceded by forming an isolation layer on the single crystalline semiconductor substrate, the isolation layer defining an active region, the method further comprising:
   forming a bulk metal oxide semiconductor (MOS) transistor on the active region, the bulk MOS transistor including a gate electrode, a source region and a drain region, the gate electrode crossing over the active region and the source and drain regions being respectively formed on the active region on first and second sides of a channel region under the gate electrode.

18. The method of claim 17, wherein the single crystalline semiconductor plug contacts at least one of the source and drain regions of the bulk MOS transistor.

19. A method of fabricating a thin film transistor (TFT) static random access memory (SRAM) cell having first and second half-cells, the method of fabricating the method of fabricating the first and/or second half-cell comprising:
   forming an isolation layer on a single crystalline semiconductor substrate to define an active region of the semiconductor substrate;
   forming a driver transistor, on the active region, including a driver gate electrode that crosses over the active region and source and drain regions on first and second sides, respectively, of a channel region under the driver gate electrode;
   forming an interlayer insulating layer on the semiconductor substrate and the driver transistor;
   forming a single crystalline semiconductor plug that extends through the interlayer insulating layer and contacts the drain region of the driver transistor;
   forming a molding layer pattern on the semiconductor substrate and the single crystalline semiconductor plug, the molding layer pattern defining an opening therein that exposes at least a portion of the single crystalline semiconductor plug;
   forming a single crystalline semiconductor epitaxial pattern on the exposed portion of the single crystalline semiconductor plug using a selective epitaxial growth technique that uses the exposed portion of the single crystalline semiconductor plug as a seed layer; and
   forming a single crystalline semiconductor region in the opening, the single crystalline semiconductor region including at least a portion of the single crystalline semiconductor epitaxial pattern.

20. The method of claim 19, wherein forming the single crystalline semiconductor plug comprises:
   patterning the interlayer insulating layer to form a node contact hole that exposes at least a portion of the drain region of the driver transistor; and
   growing a single crystalline semiconductor epitaxial layer in the node contact hole using a selective epitaxial growth technique that uses the exposed portion of the drain region as a seed layer.

21. The method of claim 20, further comprising planarizing the single crystalline semiconductor epitaxial layer.

22. The method of claim 19, wherein forming the molding layer pattern comprises:
   forming a molding layer on the semiconductor substrate and the single crystalline semiconductor plug; and
   patterning the molding layer to expose at least a portion of the single crystalline semiconductor plug.

23. The method of claim 22, wherein the molding layer comprises a silicon oxide layer.

24. The method of claim 19, wherein forming the molding layer pattern comprises:
forming a lower molding layer on the semiconductor substrate and the single crystalline semiconductor plug;
forming an upper molding layer on the lower molding layer; and
patterning the upper and lower molding layers to expose at least a portion of the single crystalline semiconductor plug through the upper and lower molding layers.

25. The method of claim 24, wherein the lower molding layer comprises an insulating layer having an etch selectivity with respect to the interlayer insulating layer and wherein the upper molding layer comprises an insulating layer having an etch selectivity with respect to the lower molding layer.

26. The method of claim 25, wherein the lower molding layer comprises a silicon nitride layer and wherein the upper molding layer comprises a silicon oxide layer.

27. The method of claim 19, wherein forming the molding layer pattern comprises:
forming a sacrificial layer pattern on the semiconductor substrate and the single crystalline semiconductor plug;
forming a molding layer on the sacrificial layer pattern and the interlayer insulating layer;
planarizing the molding layer to expose at least a portion of an upper surface of the sacrificial layer pattern; and
selectively removing the sacrificial layer pattern to expose at least a portion of the single crystalline semiconductor plug.

28. The method of claim 27, wherein the sacrificial layer pattern comprises a material layer having an etch selectivity with respect to both the interlayer insulating layer and the molding layer.

29. The method of claim 28, wherein the sacrificial layer pattern comprises a silicon nitride layer and wherein the molding layer comprises a silicon oxide layer.

30. The method of claim 19, wherein forming the single crystalline semiconductor region comprises planarizing the single crystalline semiconductor epitaxial pattern until at least a portion of an upper surface of the molding layer pattern is exposed through the single crystalline semiconductor epitaxial pattern.

31. The method of claim 19, wherein forming the single crystalline semiconductor region comprises:
forming one of an amorphous semiconductor layer and a polycrystalline semiconductor layer on the semiconductor substrate and the single crystalline semiconductor epitaxial pattern;
crystallizing the one of the amorphous semiconductor layer and the polycrystalline semiconductor layer using a solid phase epitaxial technique; and
planarizing the crystallized semiconductor layer and the single crystalline semiconductor epitaxial pattern until at least a portion of an upper surface of the molding layer pattern is exposed through the single crystalline semiconductor epitaxial pattern.

32. The method of claim 19, wherein forming the single crystalline semiconductor region comprises:
forming one of an amorphous semiconductor layer and a polycrystalline semiconductor layer on the semiconductor substrate and the single crystalline semiconductor epitaxial pattern;
planarizing the one of the amorphous semiconductor layer and the polycrystalline semiconductor layer and the single crystalline semiconductor epitaxial pattern until at least a portion of an upper surface of the molding layer pattern is exposed; and
crystallizing the one of the planarized amorphous semiconductor layer and the planarized polycrystalline semiconductor layer using a solid phase epitaxial technique.

33. The method of claim 19, further comprising forming a load thin film transistor on the single crystalline semiconductor region, the load thin film transistor including a load gate electrode that crosses over the single crystalline semiconductor region, a drain region that is adjacent to the load gate electrode and on the single crystalline semiconductor plug, and a source region that is adjacent to the load gate electrode and located opposite to the drain region.

34. The method of claim 33, further comprising:
forming a second interlayer insulating layer on the semiconductor substrate and the load thin film transistor;
forming a second single crystalline semiconductor plug that extends through the second interlayer insulating layer and contacts the drain region of the load thin film transistor;
forming a second molding layer pattern on the semiconductor substrate and the second single crystalline semiconductor plug, the second molding layer pattern defining a second opening that exposes at least a portion of the second single crystalline semiconductor plug;
forming a second single crystalline semiconductor epitaxial pattern on the second single crystalline semiconductor plug using a selective epitaxial growth technique that uses the second single crystalline semiconductor plug as a seed layer; and
forming a second single crystalline semiconductor region in the second opening, the second single crystalline semiconductor region including at least a portion of the second single crystalline semiconductor epitaxial pattern.

35. The method of claim 34, wherein forming the second single crystalline semiconductor plug comprising forming the second single crystalline semiconductor plug using a selective epitaxial growth technique that uses the drain region of the load thin film transistor as a seed layer.

36. The method of claim 34, wherein forming the second molding layer pattern comprises:
forming a second molding layer on the semiconductor substrate and the second single crystalline semiconductor plug; and
patterning the second molding layer to expose at least a portion of the second single crystalline semiconductor plug through the second molding layer.

37. The method of claim 36, wherein the second molding layer comprises a silicon oxide layer.

38. The method of claim 34, wherein forming the second molding layer pattern comprises:
forming a second lower molding layer on the semiconductor substrate and the second single crystalline semiconductor plug;
forming a second upper molding layer on the second lower molding layer; and
patterning the second upper and lower molding layers to expose at least a portion of the second single crystalline semiconductor plug through the second upper and lower molding layers.

39. The method of claim 38, wherein the second lower molding layer comprises an insulating layer having an etch selectivity with respect to the second interlayer insulating layer and wherein the second upper molding layer comprises an insulating layer having an etch selectivity with respect to the second lower molding layer.

40. The method of claim 39, wherein the second lower molding layer comprises a silicon nitride layer and wherein the second upper molding layer comprises a silicon oxide layer.

41. The method of claim 34, wherein forming the second molding layer pattern comprises:
   forming a second sacrificial layer pattern on the semiconductor substrate and the second single crystalline semiconductor plug;
   forming a second molding layer on the second sacrificial layer pattern and the second interlayer insulating layer;
   planarizing the second molding layer to expose at least a portion of an upper surface of the second sacrificial layer pattern; and
   selectively removing the second sacrificial layer pattern to expose at least a portion of the second single crystalline semiconductor plug.

42. The method of claim 41, wherein the second sacrificial layer pattern comprises a material layer having an etch selectivity with respect to both the second interlayer insulating layer and the second molding layer.

43. The method of claim 42, wherein the second sacrificial layer pattern comprises a silicon nitride layer and wherein the second molding layer comprises a silicon oxide layer.

44. The method of claim 34, wherein forming the second single crystalline semiconductor region comprises planarizing the second single crystalline semiconductor epitaxial pattern until an at least a portion of the upper surface of the second molding layer pattern is exposed.

45. The method of claim 34, wherein forming the second single crystalline semiconductor region comprises:
   forming one of a second amorphous semiconductor layer and a second polycrystalline semiconductor layer on the semiconductor substrate and the second single crystalline semiconductor epitaxial pattern;
   crystallizing the one of the second amorphous semiconductor layer and the second polycrystalline semiconductor layer using a solid phase epitaxial technique; and
   planarizing the crystallized second semiconductor layer and the second single crystalline semiconductor epitaxial pattern until at least a portion of an upper surface of the second molding layer pattern is exposed.

46. The method of claim 34, wherein forming the second single crystalline semiconductor region comprises:
   forming one of a second amorphous semiconductor layer and a second polycrystalline semiconductor layer on the semiconductor substrate and the second single crystalline semiconductor epitaxial pattern;
   planarizing the one of the second amorphous semiconductor layer and the second polycrystalline semiconductor layer and the second single crystalline semiconductor epitaxial pattern until at least a portion of an upper surface of the second molding layer pattern is exposed; and
   crystallizing the planarized second semiconductor layer using a solid phase epitaxial technique.

47. The method of claim 34, further comprising forming a transfer thin film transistor serving as a transfer transistor on the second single crystalline semiconductor region, the transfer thin film transistor including a transfer gate electrode that crosses over the second single crystalline semiconductor region, a source region that is adjacent to the transfer gate electrode and is located on the second single crystalline semiconductor plug, and a drain region that is adjacent to the transfer gate electrode and is located opposite to the source region.

48. The method of claim 47, further comprising:
   forming a third interlayer insulating layer on the semiconductor substrate and the transfer thin film transistor; and
   forming a metal node plug that extends through the first, second and third interlayer insulating layers, the metal node plug including a metal layer having an ohmic contact with the drain region of the driver transistor, the single crystalline semiconductor plug, the drain region of the load thin film transistor, the second single crystalline semiconductor plug and the source region of the transfer thin film transistor.

49. The method of claim 33, further comprising forming a transfer transistor on the active region during formation of the driver transistor, the transfer transistor including a transfer gate electrode that crosses over the active region and drain regions on first and second sides of a channel region under the transfer gate electrode, wherein the source region of the transfer transistor acts as the drain region of the driver transistor.

50. The method of claim 49, further comprising:
   forming a second interlayer insulating layer on the semiconductor substrate having the load thin film transistor; and
   forming a metal node plug that passes through the first and second interlayer insulating layers, the metal node plug including a metal layer having an ohmic contact with the drain region of the driver transistor, the single crystalline semiconductor plug and the drain region of the load thin film transistor.

* * * * *